US006986980B2

(12) United States Patent
Kubota et al.

(10) Patent No.: US 6,986,980 B2
(45) Date of Patent: Jan. 17, 2006

(54) METHOD OF PRODUCING MICRO STRUCTURE, METHOD OF PRODUCING LIQUID DISCHARGE HEAD, AND LIQUID DISCHARGE HEAD BY THE SAME

(75) Inventors: Masahiko Kubota, Tokyo (JP); Wataru Hiyama, Kanagawa (JP); Shoji Shiba, Kanagawa (JP); Hiroe Ishikura, Kanagawa (JP); Akihiko Okano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 27 days.

(21) Appl. No.: 10/615,302

(22) Filed: Jul. 9, 2003

(65) Prior Publication Data

US 2004/0131957 A1 Jul. 8, 2004

(30) Foreign Application Priority Data

Jul. 10, 2002 (JP) ............................ 2002-201971
Jul. 7, 2003 (JP) ............................ 2003-271623

(51) Int. Cl.
*G03F 7/30* (2006.01)
*B41J 2/135* (2006.01)

(52) U.S. Cl. ...................... 430/156; 430/320; 430/394; 347/20; 347/45; 347/46; 347/47; 29/890.1

(58) Field of Classification Search ................ 430/156, 430/320, 394; 347/20, 45, 46, 47; 29/890.1
See application file for complete search history.

(56) References Cited

U.S. PATENT DOCUMENTS 4,835,086 A * 5/1989 Jain ........................... 430/312
4,882,595 A 11/1989 Trueba et al. ........... 346/140 R
4,906,552 A * 3/1990 Ngo et al. .................. 430/312
4,956,264 A * 9/1990 Geissler et al. .......... 430/281.1
5,331,344 A * 7/1994 Miyagawa et al. ........... 347/65
5,478,606 A 12/1995 Ohkuma et al. ............ 427/555
6,100,010 A * 8/2000 Ina .......................... 430/273.1
6,113,214 A * 9/2000 Hirosawa et al. ............. 347/42
6,158,843 A 12/2000 Murthy et al. ................ 347/47
6,461,798 B1 * 10/2002 Ohkuma et al. ............ 430/320
6,582,890 B2 * 6/2003 Dentinger et al. .......... 430/322
6,766,579 B2 * 7/2004 Ohkuma .................. 299/890.1
2003/0011655 A1 * 1/2003 Miyagawa et al. ........... 347/20
2004/0070643 A1 * 4/2004 Kubota et al. ................ 347/20

FOREIGN PATENT DOCUMENTS

EP 0491560 A2 6/1992
EP 0715957 A2 6/1996
EP 0734866 A2 10/1996
EP 1275508 A2 1/2003
GB 1275508 A2 1/2003
JP 3010089 1/1991
JP 3143307 6/1991
JP 4-216952 8/1992
JP 6-45242 2/1994
JP 10-291317 11/1998
JP 2000326515 11/2000

* cited by examiner

*Primary Examiner*—John S. Chu
(74) *Attorney, Agent, or Firm*—Fitzpatrick, Cella, Harper & Scinto

(57) ABSTRACT

The present invention discloses a method of producing a liquid flow path shape capable of refilling ink at a high speed by optimizing a three-dimensional shape of the liquid flow path and suppressing the vibration of a meniscus and a head thereof. According to the invention, a pattern to form the liquid flow path to be formed on a substrate with a heater is formed by a positive photosensitive material in a two-layered structure of upper and lower layers, and the lower layer is used for forming the liquid flow path after being thermally crosslinked.

16 Claims, 19 Drawing Sheets

ABSORPTION SPECTRUM OF P(MMA-MAA-GMA)

ABSORPTION SPECTRUM OF P(MMA-MAA-OM)

ABSORPTION SPECTRUM OF P(MMA-MAA-METHACRYLONITRILE)

ABSORPTION SPECTRUM OF P(MMA-MAA-FUMARIC ANHYDRIDE)

METHOD OF PRODUCING MICRO STRUCTURE, METHOD OF PRODUCING LIQUID DISCHARGE HEAD, AND LIQUID DISCHARGE HEAD BY THE SAME

BACKGROUND OF THE INVENTION

1. Field of the Invention

The present invention relates to a method of producing a micro structure suitable for the production of a liquid jet recording head (which may be referred to as a liquid discharge head) for generating small droplets of a recording solution used in an ink jet recording method, a method of producing a liquid jet recording head using this method and a liquid jet recording head obtained thereby. Particularly, the present invention relates to a technique useful for a method for producing a liquid flow path shape for achieving a high speed recording process and a head thereof.

Moreover, the present invention relates to an ink jet head having an improvement of ink discharge characteristics according to a method of producing an ink jet head.

2. Related Background Art

A liquid discharge head, which is adapted to an ink jet recording method (liquid discharge recording method) for performing recording by discharging a recording liquid such as ink, generally includes a liquid flow path, a liquid discharge energy generating unit formed on parts of the liquid flow path and a fine recording liquid discharge port (hereinafter, referred to as "orifice") for discharging the liquid of the liquid flow path by a heat energy of the liquid discharge energy generating unit. Conventionally, methods for producing such a liquid discharge recording head include, for example, (1) a method in which a through hole for supplying ink is formed on an element substrate with heaters for generating a heat energy to discharge a liquid, a drive circuit for driving these heaters and so on, the wall of the liquid flow path is patterned by negative photosensitive resist and a plate with an ink discharge port is bonded thereto by electroforming or excimer laser working; and (2) a method in which an element substrate formed in the same way as the above method is prepared, a liquid flow path and an ink discharge port are formed on a resin film (preferably, polyimide) coated with an adhesive layer by excimer laser and then a processed plate of a liquid flow path structure and the element substrate are bonded by applying a heat and a pressure.

In the ink jet head produced by the above methods, the distance between the heaters and the discharge port affecting a discharge amount must be as short as possible in order to enable the discharge of a small droplet of liquid for high quality recording. For this, there is a need to decrease the height of the liquid flow path and decrease the size of a discharge chamber or discharge port acting as a bubble generating chamber which is a part of the liquid flow path and is contacted with the liquid discharge energy generating unit. That is, in order to enable the discharge of a small droplet of liquid by the head produced by the above methods, the liquid flow path structure to be laminated on the substrate needs to be thinned. However, it is very difficult to process the thin liquid flow path structure plate at a high precision and bond it to the substrate.

To solve the problems of these methods, Japanese Patent Application Laid-Open No. 6-45242 discloses an ink jet head production method (hereinafter, abbreviated as "patterning method") in which the pattern of a liquid flow path is formed of a photosensitive material on a substrate with a liquid discharge energy generating element, a coating resin layer is coated on the substrate for coating the pattern, an ink discharge port communicating with the pattern of the liquid flow path is formed on the coating resin layer and then the photosensitive material used in the pattern is removed. In this head production method, the photosensitive material is a positive resist from a viewpoint of removal convenience. In addition, according to this method, since a photolithography technique of a semiconductor is applied, it is possible to perform a fine working at a very high precision for the formation of the liquid flow path, discharge port and so on. However, in the method which has adapted to this semiconductor production method, basically, a shape change of the regions near the liquid flow path and the discharge port is limited to the change in a two-dimensional direction in parallel with the element substrate. In other words, since the patterns of the liquid flow path and the discharge port are made of the photosensitive material, the photosensitive material layer cannot be partially multilayered. Thus, it is impossible to obtain a desired pattern with alteration in the height direction to the pattern of the liquid flow path and the like (that is, a shape in a height direction from the element substrate is substantially same and limited). As a result, this becomes an obstacle in designing the liquid flow path to implement a stable discharging at a high speed.

Japanese Patent Application Laid-Open No. 10-291317 discloses an implementation of a change of the shape of a liquid flow path in a three-dimensional direction, that is, in an interplanar direction in parallel with the element substrate and in a height direction from an element substrate, by controlling a processing depth of a resin film by partially changing the opacity of a laser mask in the excimer laser working of the liquid flow path. Although such a control in the depth direction in the laser working is possible in principle, the excimer laser used in this working is different from the one used in exposure of a semiconductor but is a laser of a high brightness used in a broad band and suppresses a deviation of illuminance within a laser irradiation surface, thereby making it difficult to implement the stabilization of a laser illuminance. Particularly, in an ink jet head of high image quality, the unevenness of the discharge characteristics caused by a deviation of a processed shape between discharge nozzles is recognized as a spot in an image, thus it is a big task to achieve the improvement of a processing precision.

Moreover, there are frequent occasions when a fine patterning is impossible due to a taper on a laser working surface.

By the way, Japanese Patent Application Laid-Open No. 4-216952 discloses a method in which a first layer of negative resist is formed on a substrate, a latent image of a desired pattern is formed, the first layer is coated by a second layer of negative resist, a latent image of a desired pattern is formed only no the second layer, and finally the latent image of the pattern of the upper and lower layers are developed. In this method, the negative resists of the two upper and lower layers have a different sensitive wavelength region from each other. The both upper and lower resist layers are ones sensitive to ultra violet (UV) rays, or the negative upper resist layer is one sensitive to ultra violet rays and the negative lower resist layer is one sensitive to ionizing radiation such as deep-UV, electron beams, X-rays and so on. According to this method, by using the negative resists of the two upper and lower layers each having a different sensitive wavelength region, a pattern latent image changed in shape can be formed in a height direction from the substrate as well as in the direction parallel to the substrate.

Hence, the present inventors studied the application of the technique disclosed in Japanese Patent Application Laid-Open No. 4-216952 to the above-mentioned pattern forming method and thought that, if the technique of Japanese Patent Application Laid-Open No. 4-216952 is applied to the formation of the pattern of the liquid flow path in the pattern forming method, the height of a positive resist which forms the pattern of the liquid flow path can be changed locally.

Practically, it has been attempted to use an alkali development positive photoresist comprising a composite of alkali soluble resin (Novolak resin or polyvinylphenol) and naphthoquinone diazide derivative as the resist which is soluble, removable and sensitive to UV; polymethylisopropenyl ketone (PMIPK) as the resist sensitive to ionizing radiation; further, to form upper and lower layers having a different pattern with respect to the substrate, as disclosed in Japanese Patent Application Laid-Open No. 4-216952. However, this alkali development positive photoresist could not be adapted to the pattern formation of two layers since it is instantly dissolved in a developing solution of PMIPK.

For this reason, this invention is focused on finding a combination of positive photosensitive materials of upper and lower layers capable of forming a pattern that is changed in shape in a height direction with respect to the substrate in the pattern forming method.

SUMMARY OF THE INVENTION

The present invention is designed in consideration of the problems of the prior art, and therefore it is an object of the present invention to provide a method of producing a micro structure useful for producing a liquid discharge head that is low-priced, precise and high in reliability.

It is another object of the present invention to provide a method of producing a liquid discharge head using the above micro structure production method and a liquid discharge head obtained thereby.

It is still another object of the present invention to provide a method of producing a novel liquid discharge head having a liquid flow path finely processed with a high precision and with a good yield.

It is yet still another object of the present invention to provide a method of producing a novel liquid discharge head which has a small mutual influence with a recording solution and is excellent in mechanical strength or chemical resistance.

Particularly, the present invention relates to a method of producing a liquid flow path shape capable of refilling ink at a high speed by optimizing a three-dimensional shape of the liquid flow path and suppressing the vibration of a meniscus and a head thereof.

It is another object of the present invention to provide a method of producing a novel liquid discharge head which is finely processed with a high precision and with a good yield.

It is still another object of the present invention to provide a method of producing a novel liquid discharge head which has a small mutual influence with a recording solution and is excellent in mechanical strength or chemical resistance.

To achieve the above objects, firstly, the present invention practically accomplishes a production method for forming a liquid flow path (in case of using ink, referred to as an ink flow path) of a three-dimensional shape with a high precision and provides a good liquid flow path shape that can be achieved by the production method.

That is, the present invention comprises respective inventions.

In a first aspect of the micro structure producing method of the present invention, there is provided a method of producing a micro structure on a substrate, which comprises the steps of: forming on a substrate a first positive photosensitive material layer for photosensitizing by ionizing irradiation of a first wavelength band in a crosslinked state and forming a lower layer composed of a crosslinked positive photosensitive material layer by heat treating this positive photosensitive material layer; forming on the lower layer an upper layer composed of a second positive photosensitive material for photosensitizing by ionizing radiation of a second wavelength band to thereby obtain a two-layered structure; forming the upper layer into a desired pattern by irradiating the ionizing radiation of the second wavelength band to a predetermined portion of the upper layer of the two-layered structure and removing only the irradiated area of the upper layer by development treatment; and forming the lower layer into a desired pattern by irradiating the ionizing radiation of the first wavelength band to a predetermined portion of the lower layer exposed by the pattern forming of the upper layer and conducting a development treatment.

In the first aspect of the liquid discharge head producing method of the present invention, there is provided a method of producing a liquid discharge head, which forms a liquid flow path by forming a pattern of removable resin on a liquid flow path forming portion on a substrate having a liquid discharge energy generation element, coating and hardening a resin coating layer on the substrate to coat the pattern and dissolving and removing the pattern, wherein the pattern is formed by the micro structure producing method of the first aspect.

In a second aspect of the micro structure producing method of the present invention, there is provided a method of producing a micro structure, which comprises the steps of: forming on a substrate a first photosensitive material layer for photosensitizing by a light of a first wavelength band and forming a thermally crosslinkable film from the first photosensitive material layer for photosensitizing the light of the first wavelength band by thermal crosslinking reaction; forming on the first photosensitive material layer a second photosensitive material layer for photosensitizing a light of a second wavelength band; reacting only a desired area of the second photosensitive material layer by irradiating the light of the second wavelength band through a mask to the substrate surface formed with the first and second photosensitive material layers, forming a desired pattern by development and forming a desired slope on a side wall of the pattern by heating the substrate; reacting a desired area of the first photosensitive material layer by irradiating the light of the first wavelength band through a mask to the substrate surface formed with the first and second photosensitive material layers, and which differentiates the upper and lower patterns with respect to the substrate using the process consisting of the above steps, wherein the first and second photosensitive material layers are positive photosensitive materials and the light of the first and second wavelength bands is ionizing radiation.

In the second aspect of the liquid discharge head producing method of the present invention, there is provided a method of producing a liquid discharge head, which forms the liquid flow path by forming a pattern of removable resin on a liquid flow path forming portion on a substrate having a liquid discharge energy generation element, coating and hardening a resin coating layer on the substrate to coat the pattern and dissolving and removing the pattern, wherein the pattern is formed by the micro structure producing method of the second aspect.

In each of the above aspects, preferably, the positive photosensitive material of the lower layer is an ionizing radiation decomposition type positive resist having a main component composed of methacrylate ester, a thermally crosslinkable factor composed of methacrylic acid and a sensitivity region widening factor composed of, preferably, methacrylic acid, glycidyl methacrylate, 3-oxyimino-2-butanon methyl methacrylate, methacrylonitril or anhydrous furmaric acid, and the positive photosensitive resin material of the upper layer is an ionizing radiation decomposable positive resist having polymethylisopropenyl ketone as a primary component.

Preferably, in the liquid discharge head according to the production method of the present invention, a column-shaped member for capturing dust is formed on a liquid flow path as a material for forming the liquid flow path and this member does not reach to the substrate.

Preferably, in the liquid discharge head according to the production method of the present invention, a liquid supply opening commonly connected to each of the liquid flow paths is formed on the substrate and the height of the liquid flow path on the center portion of the liquid supply opening is lower than that of the liquid flow path on the opening circumferential portion of the liquid supply opening.

Preferably, in the liquid discharge head according to the production method of the present invention, a bubble generating chamber on the liquid discharge energy generation element preferably has a convex cross-sectional shape.

By forming the lower layer of the pattern using the thermally crosslinkable positive photosensitive material according to the present invention, it is possible to reduce or overcome a decrease of a pattern film thickness due to a developing solution during development and prevent the formation of a compatible layer generated on the interface by a solvent upon the coating of a coating layer composed of a negative photosensitive material. Besides, it is possible to reduce or prevent a decrease of a film thickness due to a developing solution upon developing of the upper layer composed of a positive photosensitive material.

BRIEF DESCRIPTION OF THE DRAWINGS

Other objects and aspects of the present invention will become apparent from the following description of examples with reference to the accompanying drawing in which.

DESCRIPTION OF THE PREFERRED EMBODIMENTS

Figure 1A:
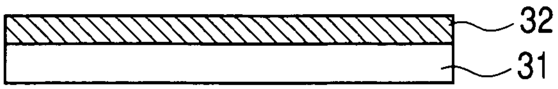
FIGS. 1A, 1B, 1C, 1D, 1E, 1F and 1G are views illustrating a basic process flow of a production method of the present invention.

Next, an example of the production of a liquid discharge head according to the present invention will be described in detail.

In the production of the liquid discharge head according to the present invention, there is an advantage in that the distance between a discharge energy generating element (for example, heater) and an orifice (discharge port) and the positioning deviation between this element and the center of the orifice can be set very easily. That is, according to the present invention, it is possible to set the distance between the discharge energy generating element and the orifice by controlling a coating thickness of a photosensitive material layer coated two times. Furthermore, the coating thickness of the photosensitive material layer can be strictly controlled by a conventional thin film coating technique with good reproducibility. In addition, the discharge energy generating element and the orifice can be optically positioned by the photolithography technique, and they can be positioned with a precision remarkably higher than the method of bonding a liquid flow path structure plate to a substrate which is commonly used in conventional processes for production of liquid discharge recording head.

Moreover, it is known that polymethylisopropenyl ketone (PMIPK) or polyvinyl ketone is useable as a soluble resist layer. These positive resists are ones having an absorption peak near a 290 nm wavelength. By combining such resist with another resist of a different photosensitive wavelength region than the above resist, a two-layered liquid flow path pattern can be formed.

However, the production method of the present invention is characterized in that the pattern of a liquid flow path is formed of soluble resin, then coated with resin forming a flow path member and finally the material of the pattern is dissolved and removed. Hence, the pattern material to be dissolved and removed at a final stage is applicable to this method. After the pattern formation, as the resist capable of dissolving this pattern, two kinds of resists are used including an alkali development positive photoresist commonly applied to a semiconductor photography process and composed of a composite of an alkali soluble resin (novolak resin or polyvinylphenol) and a naphthoquinone diazide derivative, or an ionizing radiation decomposition type resist. A photosensitive wavelength region of the alkali development positive photoresist is generally ranged of 400 to 450 nm and has a different photosensitive wavelength region from polymethyliopropenyl ketone (PMIPK). Practically, this alkali development positive photoreist is instantly dissolved in a developing solution of PMIPK and thus cannot be applied to the formation of a two-layered pattern.

A polymer composition composed of methacrylate ester, such as polymethyl methacrylate (PMMA) which is one of ionizing radiation decomposition type resists, is a positive resist having a peak in the region of less than 220 nm sensitive wavelength. Additionally, by composing a ternary copolymer which contains methacrylate as a thermal crosslinkable factor and a methacrylate anhydride as a factor to extend the sensitivity region, an unexposed portion of a thermal crosslinked film itself is scarcely dissolved in the developing solution of PMIPK and thus cannot be applied to the formation of a two-layered pattern. Therefore, a resist layer (PMIPK) consisting of polymethylisopropenyl ketone is formed on the aforementioned resist (P(MMA-MAA)), then the PMIPK of the upper layer is exposed and developed in a wavelength band near 290 nm (260 to 330 nm) which is a second wavelength band, and continually the PMMA of the lower layer is exposed and developed by ionizing radiation in a wavelength band (210 to 330 nm) which is a first wavelength band, thereby forming a two-layered liquid flow path pattern.

Thermal crosslinkable resist according to the present invention comprises most preferably methacrylate ester copolymerized with a methacrylic group as a crosslinkable group. As a unit composed of methacrylate ester, a monomer unit represented by the following formula (1) can be used.

(1)

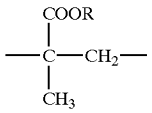

(wherein R denotes an alkyl group or phenyl group having 1 to 4 carbon atoms)

The monomers for introducing the above monomer unit include, for example, methacrylate methyl, methacrylate ethyl, methacrylate butyl, methacrylate phenyl and so on. A crosslinkable by thermal treatment is carried out by dehydration and condensation reactions.

In addition, as a result of deep examination by the present inventors, it was found out that, as a thermal crosslinkable resist, especially, a photodegradable positive resist having an anhydrous structure of carboxylate (carboxylic acid) is preferably used. The photodegradable positive resist having an anhydrous structure of carboxylate used in the present invention can be obtained, for instance, by radically polymerizing methacrylate anhydride or by copolymerizing another monomer such as methacrylate anhydride and methyl methacrylate. Particularly, the photodegradable positive resist having an anhydrous structure of carboxylate using methacrylate anhydride as a monomer component can be given an excellent solvent tolerance by thermal treatment without damaging sensitivity to occur photodegradation. Accordingly, the aforementioned positive resist is properly used in the present invention since it generates no damage such as dissolution and deformation in the coating of a second positive photosensitive resist layer and a flow path forming material to be described later.

Specifically, the first positive photosensitive material is exemplified which has a structural unit represented by the following formulas 1 and 2:

General Formula 1

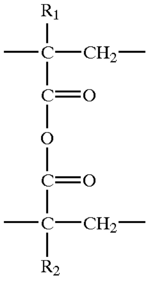

-continued

General Formula 2

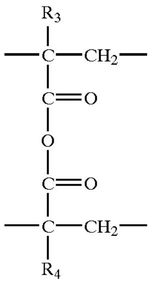

(wherein $R_1$ to $R_4$ denote a hydrogen atom or alkyl group having 1 to 3 carbon atoms and they may be the same or different from each other.)

In addition, the first positive photosensitive material may have a structural unit represented by the following formula 3:

General Formula 3

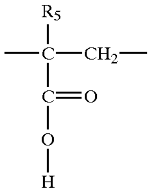

(wherein $R_5$ denotes a hydrogen atom or alkyl group having 1 to 3 carbon atoms.)

As a factor for extending a sensitivity region, the one having a function for widening a wavelength region representing photosensitivity can be selectively used. That is, monomer units can be properly utilized which are obtained by copolymerizing a monomer capable of extending the sensitivity region by a long wavelength side represented by the following formulas (2) to (6).

(2)

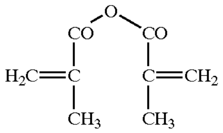

(3)

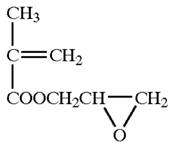

(4)

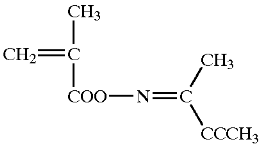

(5)

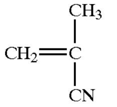

-continued (6)

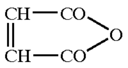

The amount of these monomer units acting as the factor for extending the sensitivity region to be admixed in a copolymer is preferably 5 to 30% by weight relative to the overall copolymer amount.

In addition, in case that the factor for extending the sensitivity region is glycidyl methacrylate, it is preferable that a ternary copolymer has a methacrylate content of 2 to 30% by weight relative to the copolymer and it is prepared by radical polymerization at a temperature of 60 to 80° C. using an azo compound or peroxide as a polymerization initiator.

In addition, in case that the factor for widening the sensitivity region is 3-oxyimino-2-butanon methyl methacrylate represented by the formula (4), it is preferable that a ternary copolymer has a methacrylate content of 2 to 30% by weight relative to the copolymer and it is prepared by radical polymerization at a temperature of 60 to 80° C. using an azo compound or peroxide as a polymerization initiator.

In addition, in case that the factor for widening the sensitivity region is methacrylonitryl represented by the formula (5), it is preferable that a ternary copolymer has a methacrylate content of 2 to 30% by weight relative to the copolymer and it is prepared by radical polymerization at a temperature of 60 to 80° C. using an azo compound or peroxide as a polymerization initiator.

Moreover, in case that the factor for widening the sensitivity region is fumaric acid anhydride (maleic acid anhydride) represented by the formula (6), it is preferable that a ternary copolymer has a methacrylate content of 2 to 30% by weight relative to the copolymer and it is prepared by radical polymerization at a temperature of 60 to 80° C. using an azo compound or peroxide as a polymerization initiator.

It is preferred that the copolymer ratio of a crosslinkable component is optimized by a coating thickness of a lower layer resist. Preferably, a copolymer content of methacrylate acting as a thermal crosslinkable factor is 2 to 30% by weight relative to the overall copolymer, more preferably, 2 to 20% by weight.

The ternary copolymer contained in the first positive photosensitive material used in the present invention has preferably a weight average molecular weight of 5,000 to 50,000. By having a molecular weight in this range, it is possible to secure a better solubility by a solvent coating solvent, and in addition, it is possible to effectively achieve the evenness of a coating thickness in a coating process by spin coating within an appropriate range of the viscosity of the solution. Moreover, by having a molecular weight in this range, it is possible to improve sensitivity to ionizing radiation having an extended photosensitive wavelength region, for example, a 210 to 330 nm wavelength region, and it is possible to improve decomposition efficiency all the more in a irradiation region by reducing an exposure amount for forming a desired pattern at a desired coating thickness with a good efficiency. Further, it is possible to improve a development property endurance to a developing solution and make better the precision of a pattern to be formed.

The developing solution of the first positive photosensitive resist comprises but is not limited to a solvent which is capable of dissolving at least an exposed portion, is less to dissolve an unexposed portion and does not dissolve a second flow path pattern. Such a developing solution may include methylisobutyl ketone and the like. As a result of the present inventors' examination, it was found out that the developing solution satisfying the above characteristics preferably include glycol ethers having more than 6 carbon atoms miscible with water at any certain ratio, a nitrogen-containing basic organic solvent and a developing solution containing water. The glycol ethers include ethylenglycol monobutylether and/or diethyleneglycol monobutylether. The nitrogen-containing basic organic solvent preferably includes ethanolamine and/or morpholin. For instance, as a developing solution for PMMA (polymethyl methacrylate) used as a resist in an X-ray lithography, a developing solution of the composition disclosed in Japanese Patent Application Laid-Open No. 3-10089 can also be preferably used in the present invention. A developing solution having a composition ratio of the aforementioned components may be used, for example, a developing solution composed of

| | |
|---|---|
| Diethyleneglycol monobutylether | 60 vol % |
| Ethanolamine | 5 vol % |
| Morpholine | 20 vol % |
| Ion exchanged water | 15 vol % |

Hereinafter, a process flow of a liquid flow path formation according to the production method of the present invention will be described in detail.

FIGS. 1A, 1B, 1C, 1D, 1E, 1F and 1G show the most preferable process flow in which a thermal crosslinkable positive resist is applied as a lower layer resist. FIGS. 2A, 2B, 2C and 2D show a subsequent process following the process of FIGS. 1A to 1G.

In FIG. 1A, a thermal crosslinkable positive resist layer 32 is coated over a substrate 31 and then baked. The coating process is performed by a solvent coating method such as spin coating or bar coating known in prior art. In addition, the baking process is preferably performed for 30 minutes to two hours at a baking temperature of 160 to 220° C. at which a crosslinking reaction is carried out.

Figure 1B:
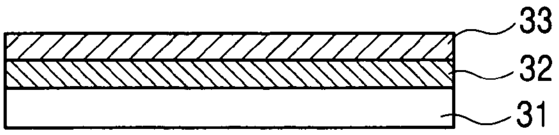

Following to the above, as shown in FIG. 1B, a positive resist layer 33 having PMIPK as a primary component is coated over the upper layer of the thermal crosslinkable positive resist, and then is free-baked. In general, the lower layer is known to be slightly dissolved by a coating solvent in the PMIPK coating process on the upper layer to form an compatible layer. But, the composition according to the present invention is crosslinkable, thereby not forming the compatible layer at all.

Figure 1C:
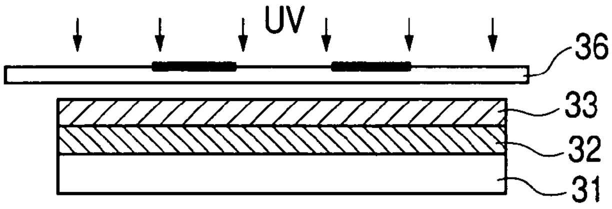
Figure 3:
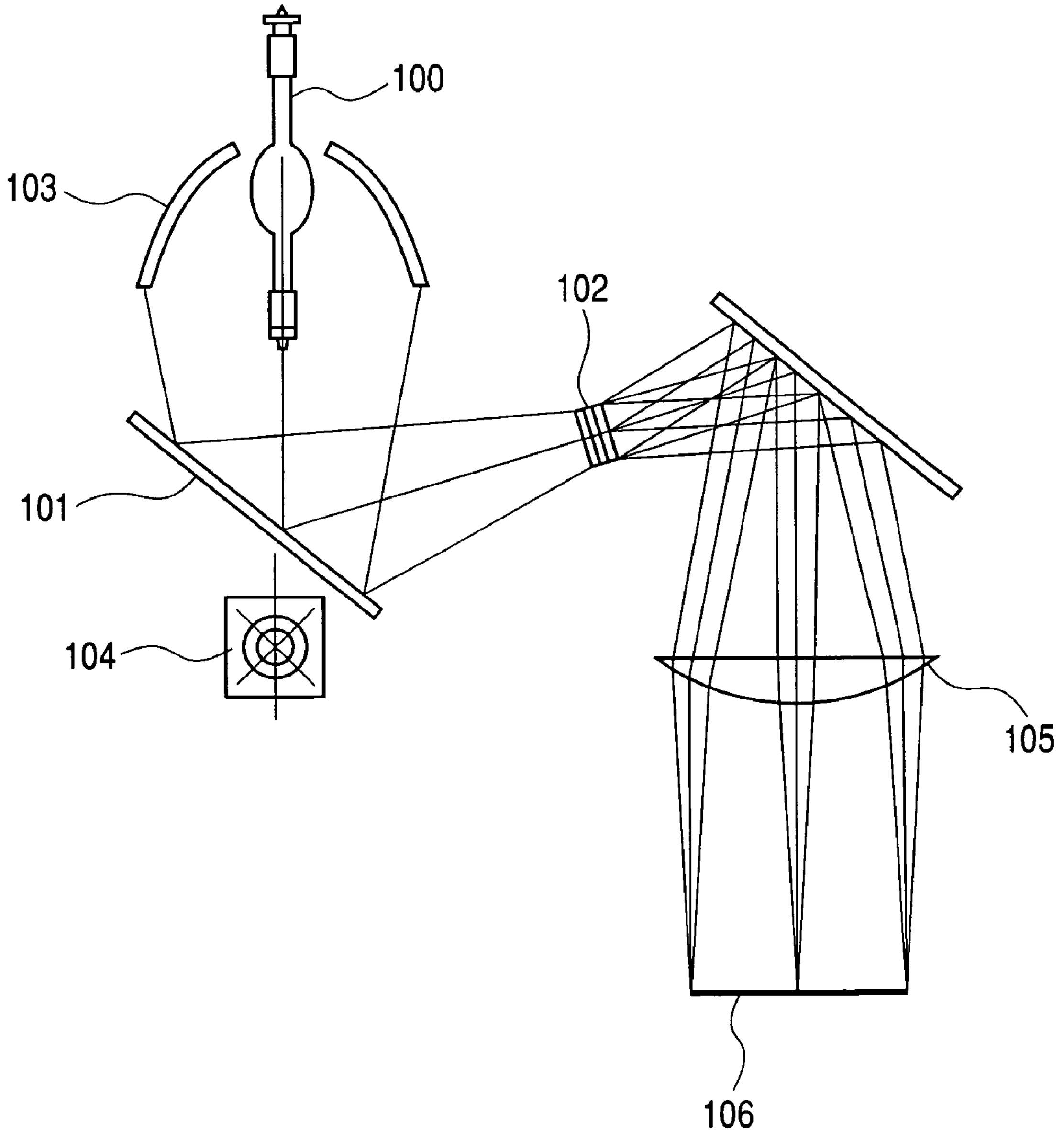
FIG. 3 is a schematic view of a general exposure apparatus and a reflectance spectrum of two kinds of cold mirrors.
Figure 4:
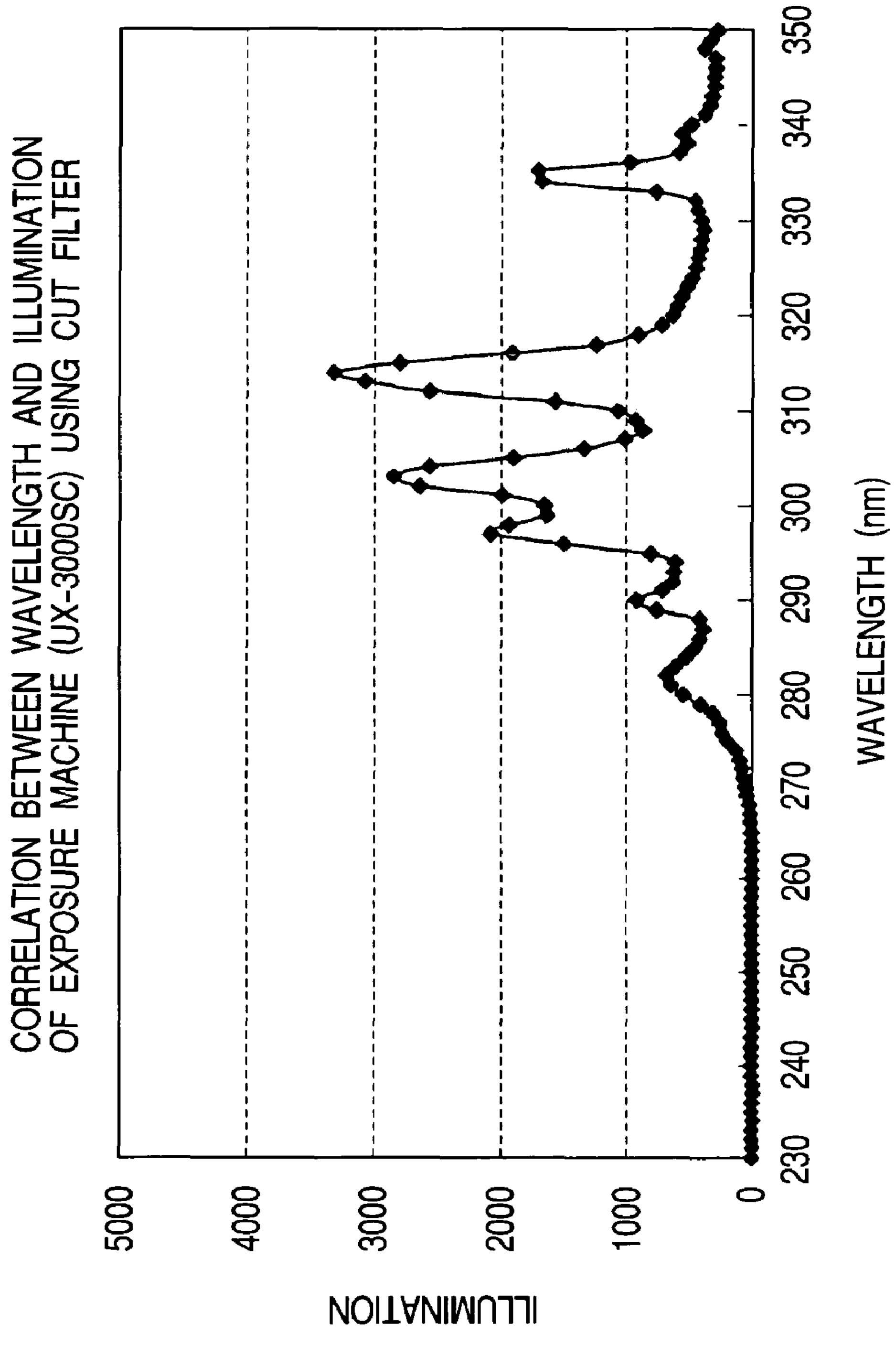
FIG. 4 is a view illustrating a process flow in case that a thermally crosslinkable methacrylate resist is used for a lower layer in the production method of the present invention.

Successively, as shown in FIG. 1C, there is preferably used a cold mirror exposing a PMIPK layer, which is the positive resist layer 33, and reflecting a wavelength of near 290 nm well. For example, using a mask aligner UX-3000SC (commercially available by Ushio Denki Kabushiki Kaisha), as shown in FIG. 3, by using a cut filter for cutting off light of less than 260 nm in front of an integrator including a fly-eye lens, it is possible to permeate only the light of 260 to 330 nm which is a second wavelength band, as shown in FIG. 4.

A photosensitive wavelength band of photosensitive material (that is, an ionizing radiation resist) in the present invention means a wavelength region which a polymer of main chain cleavage type absorbs the light and is changed into its excited state by irradiation of ionizing radiation within the upper or lower limits of wavelengths, thereby breaking the main chain thereof. As a result, a high molecular polymer is turned into a low molecular polymer and the solubility to the developing solution increases during the developing process to be described later.

Figure 1D:
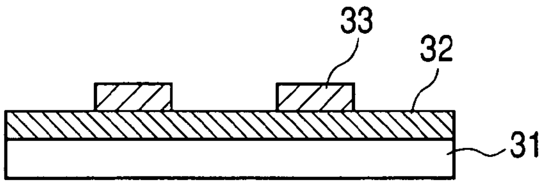

Subsequently, as shown in FIG. 1D, the upper resist layer 33 is developed and, during the development process, methylisobutyl ketone, which is a developing solution for PMIPK, is preferably used. However, anything that dissolves an exposed portion of PMIPK and does not dissolve an unexposed portion will be applicable as the solvent according to the present invention.

Next, the substrate including the pattern layer of PMIPK is post-baked for 1 to 5 minutes at 100 to 120° C. A slope can be formed at a side face of the pattern according to temperature, time and pattern size, and an angle thereof can also be controlled by these parameters.

Figure 1E:
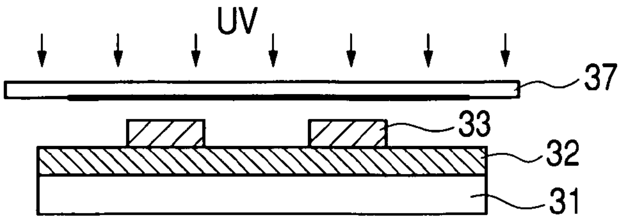
Figure 5:
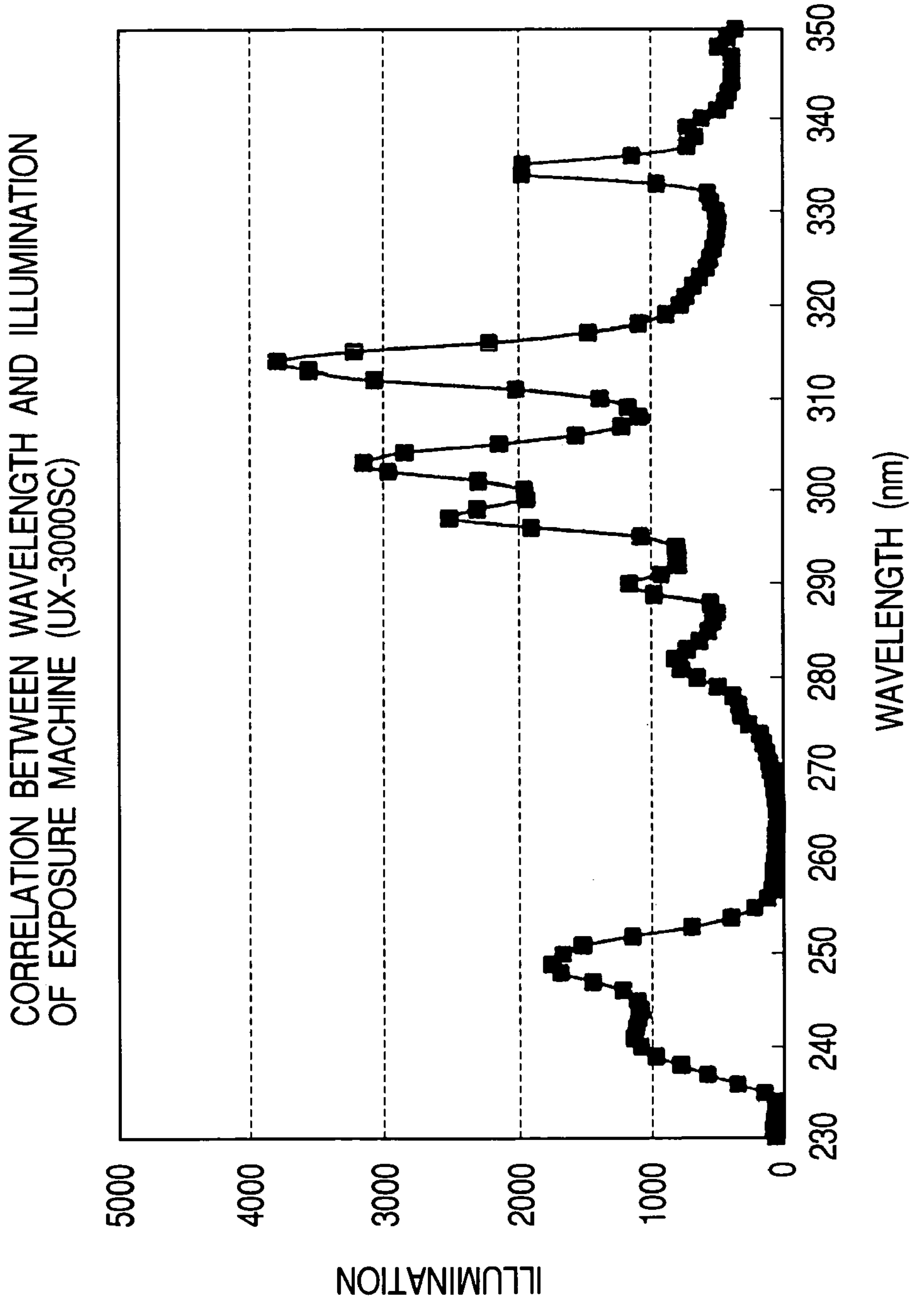
FIG. 5 is a view illustrating a subsequent process following the process of FIG. 4.

Also, as shown in FIG. 1E, a thermal crosslinkable positive resist layer 32 of the lower layer is exposed. This exposure is carried out by using light at 210 to 330 nm which is the first wavelength band as shown in FIG. 5 without using the above-described cut filter. At this time, the PMIPK of the upper layer is not sensitive to light because light is not irradiated by a photomask 37.

Figure 1F:
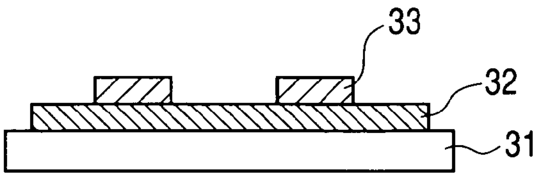

Following to the above, as shown in FIG. 1F, the thermal crosslinkable positive resist layer 32 is developed. Preferably, the development is carried out by methylisobutyl ketone. The developing solution is the same as the developing solution of the PMIPK of the upper layer, thereby the effect of the developing solution to the upper layer pattern can be eliminated.

Figure 1G:
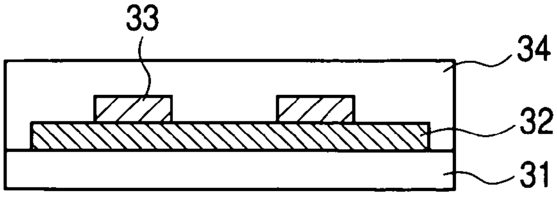

Next, as shown in FIG. 1G, a liquid flow path forming material 34 is coated over the thermal crosslinkable positive resist layer 32 of the lower layer and the positive resist layer 33 of the upper layer. The coating process is carried out by a solvent coating method such as a general spin coating method well known in the prior art.

Figure 2A:
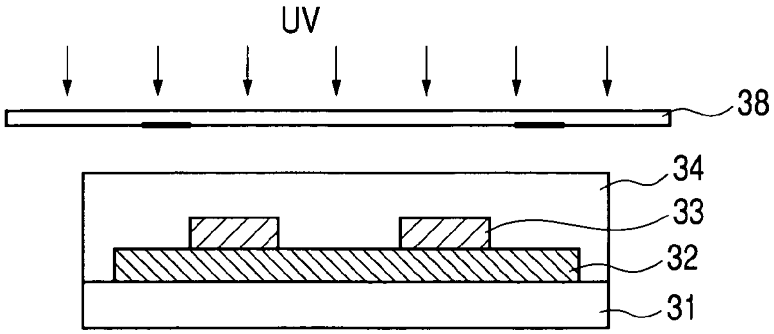
FIGS. 2A, 2B, 2C and 2D show a subsequent process following the process of FIGS. 1A, 1B, 1C, 1D, 1E, 1F and 1G.

As disclosed in Japanese Patent No. 3143307, the liquid flow path forming material is a material having onium salt as a primary component generating cations by epoxy resin of solid state and light irradiation at an ambient temperature, and has a negative property. Although FIG. 2A shows a process of performing light irradiation to the liquid flow path forming material, a photomask 38 is adapted which does not irradiate light to a portion forming an ink discharge port.

Figure 2B:
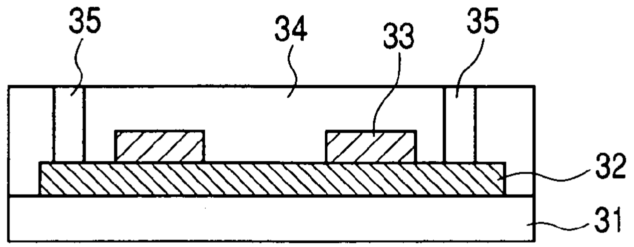

Next, as shown in FIG. 2B, the pattern development of an ink discharge port 35 is carried out with respect to a photosensitive liquid flow path forming material 34. In this pattern exposure, any exposure apparatus commonly used may be applicable in the present invention. The photosensitive liquid flow path forming material is preferably developed by an aromatic solvent, such as xylene that does not dissolve PMIPK. In addition, in case that it requires to form a water repellent coating on the liquid flow path forming material layer, as disclosed in Japanese Patent Application Laid-Open No. 2000-326515, such purpose is achieved by forming a photosensitive water repellent layer and carrying out exposure and development at the same time. At this time, the formation of the photosensitive water repellent layer may be carried out by means of lamination process.

Figure 2C:
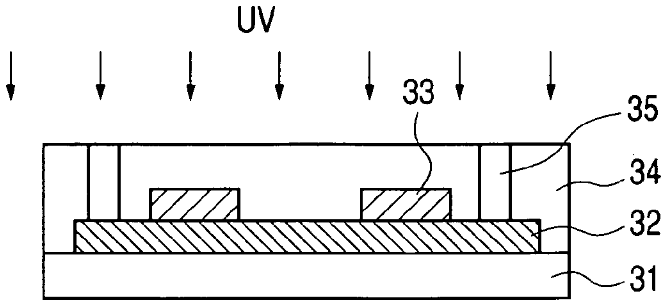

Subsequently, as shown in FIG. 2C, ionizing radiation of less than 300 nm over the liquid flow path forming material layer is entirely irradiated for a purpose of decomposing PMIPK or crosslinking resist into low molecules and easily removing them.

Figure 2D:
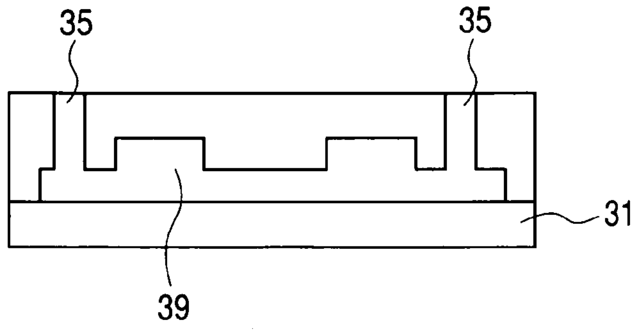

Finally, by using a solvent, the positive resists 32 and 33 used for the pattern are removed. Accordingly, as shown in FIG. 2D, obtained is a liquid flow path 39 including discharge chambers.

By applying the above-stated process, it is possible to change the height of the liquid flow path from an ink supply hole to a heater.

According to the method described above, the height of the liquid flow path can be varied from an ink supply hole to a heater. The optimization of the shape of the liquid flow path from the ink supply hole to the discharge chambers can reduce a crosstalk between the discharge chambers, as well as to be closely related to a speed of refilling ink to the discharge chambers. U.S. Pat. No. 4,882,595 invented by Trueba and et al discloses the two-dimensional characteristic of a liquid flow path formed of photosensitive resist on a substrate, i.e., the shape in a direction parallel to the substrate, and the aforementioned characteristic. While Japanese Patent Application Laid-Open No. 10-291317 invented by Murthy and et al discloses the changing of the height of a liquid flow path by processing a liquid flow path structure plate made of resin in a three-dimensional direction of interplanar and height directions.

However, there are frequent occasions when processing by excimer laser it cannot achieve a sufficient precision due to the expansion of a film caused by heat generated during the processing. Particularly, a processing precision in a depth direction of a resin film acquired by excimer laser is affected by the distribution of light intensity of the laser and the stability of a laser light, and it is impossible to obtain a high precision capable of clarifying the correlation between a liquid flow path shape and the discharge characteristics. Accordingly, Japanese Patent Application Laid-Open No. 10-291317 does not disclose a clarified correlation between a height shape of the liquid flow path and the discharge characteristics.

The method according to the present invention comprises a prior known solvent coating method such as spin coating used in semiconductor manufacturing techniques, so the liquid flow path can be formed stably with a very high precision. In addition, a two-dimensional shape in a direction parallel to the substrate is also formed by using the photolithography technique of a semiconductor, thereby it is possible to achieve a precision of submicrons unit.

By utilizing these methods, the present inventors have examined the correlation between the liquid flow path height and the discharge characteristics, and come to the invention to be described hereinafter. Referring to FIGS. 6A, 6B, 7A, 7B, 8A, 8B, 9A and 9B, preferred embodiments of a liquid flow path produced by the method of the present invention will be more particularly explained.

Figure 6A:
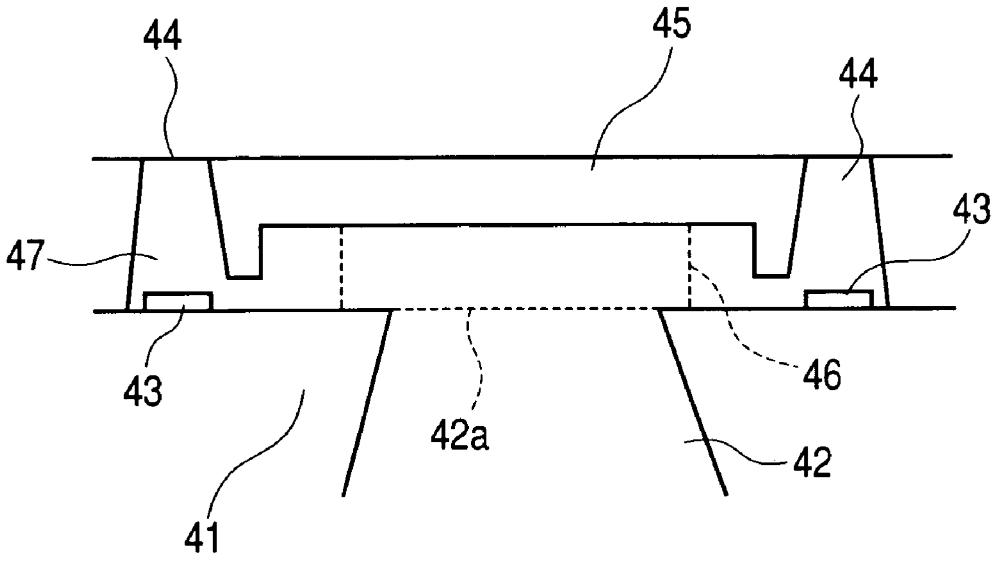
FIG. 6A is a vertical cross sectional view showing a nozzle structure of an ink jet head with an improved recording speed according to the production method of the present invention and FIG. 6B is a vertical cross sectional view showing a nozzle structure according to a conventional production method.
Figure 6B:
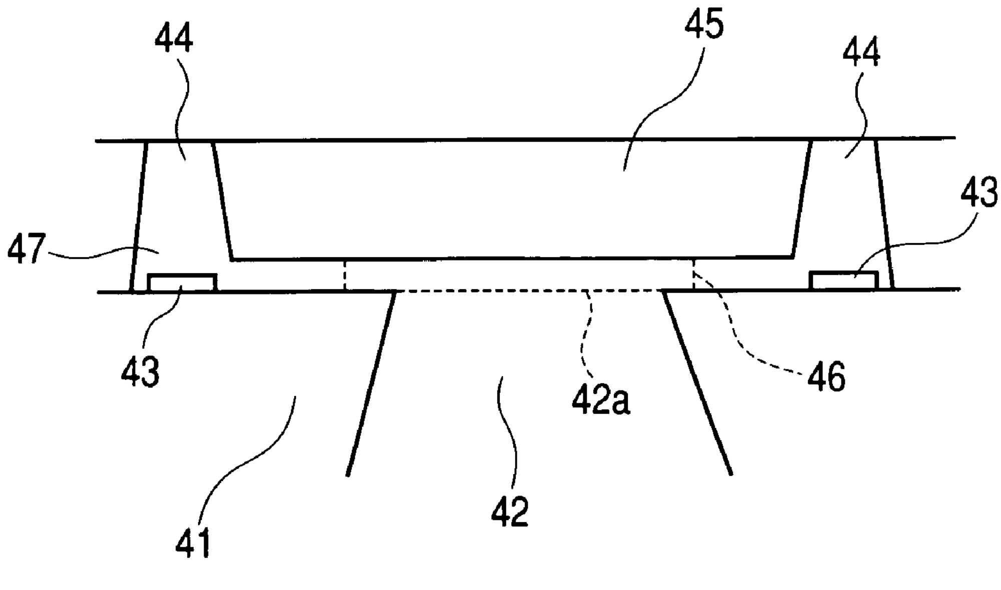

As shown in FIG. 6A, the head according to a first embodiment of the present invention is characterized in that the height of a liquid flow path from the end 42*a* of an ink supply hole 44 to discharge chambers 47 becomes smaller at the portion adjacent to the discharge chambers 47. FIG. 6B shows a liquid flow path shape as compared with the first embodiment. The speed of refilling ink to the discharge chambers 47 becomes higher since, the higher the height of the liquid flow path from the ink supply hole 42 to the discharge chambers 47 becomes, the lower the flow resistance of ink becomes. But, in case that the height of the liquid flow path becomes higher, a discharge pressure is emitted to the ink supply hole 42 too, thereby degrading energy efficiency or increasing crosstalk between the discharge chambers 47.

Therefore, the height of the liquid flow path is designed in consideration of the aforementioned both characteristics. Hence, according to this method, it is possible to change the height of the liquid flow path and achieve a liquid flow path shape of FIG. 6A. This head degrades the flow resistance of ink and enable refilling at a high speed by increasing the height of the liquid flow path from the ink supply hole 42 up to near the discharge chambers 47. Moreover, the portions near the discharge chambers 47 have a configuration to suppress the energy generated from the discharge chambers 47 from being emitted to the ink supply hole 42 and prevent crosstalk by decreasing the height of the liquid flow path.

Figure 7A:
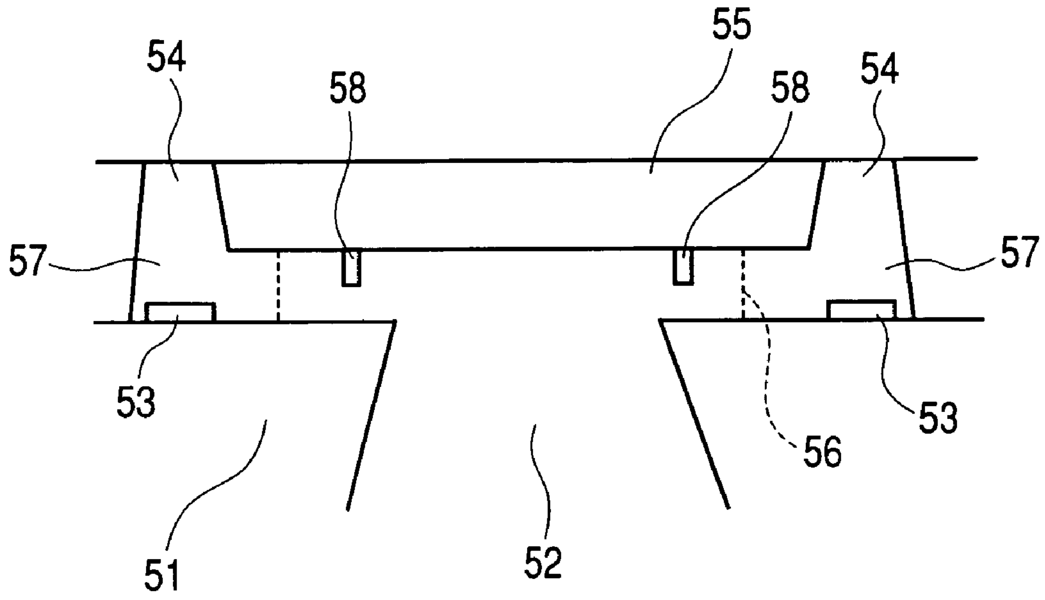
FIG. 7A is a vertical cross sectional view showing a nozzle structure of an ink jet head with an improved nozzle filter shape according to the production method of the present invention and FIG. 7B is a vertical cross sectional view showing a nozzle structure of a conventional shape.
Figure 7B:
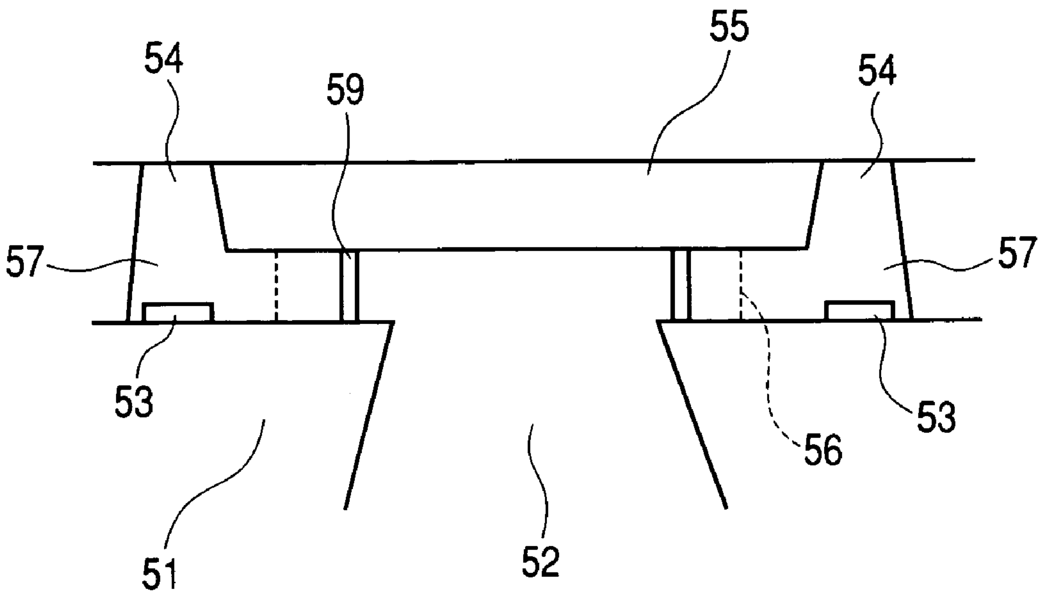

Next, as shown in FIG. 7, the head according to a second embodiment of the present invention is characterized in that a dust capture member (hereinafter, referred to as "nozzle filter") of a column shape is formed in the liquid flow path. Particularly, in FIG. 7A, a nozzle filter 58 has such a shape that it does not reach to a substrate 51. In addition, FIG. 7B shows the configuration of a nozzle filter 59 as compared with the second embodiment. These nozzle filters 58 and 59 cause the flow resistance of ink to be increased and cause the speed of refilling ink to the discharge chambers 57 to be lowered. However, in case that the ink discharge port of an ink jet head for achieving high image quality recording is very small and the nozzle filters are not formed, dusts and the like block the liquid flow path or the discharge port, thereby noticeably degrading the reliability of the ink jet head. According to the present invention, the area of the liquid flow path can be maximized while making the interval between adjacent nozzles filters same as conventional one, thereby reducing the increase of the flow resistance of ink and capturing dusts. Consequently, even if the nozzle filter of a column shape is installed in the liquid flow path, the height of the liquid flow path can be changed so that the flow resistance of ink cannot be increased.

For example, in case of capturing dusts having a diameter of over 10 $\mu$m, the distance between adjacent filters is preferably less than 10 $\mu$m. More preferably, the columns forming these nozzle filters are configured not to reach to the substrate 51 as shown in FIG. 7A, thereby increasing the sectional area of the flow path.

Figure 8A:
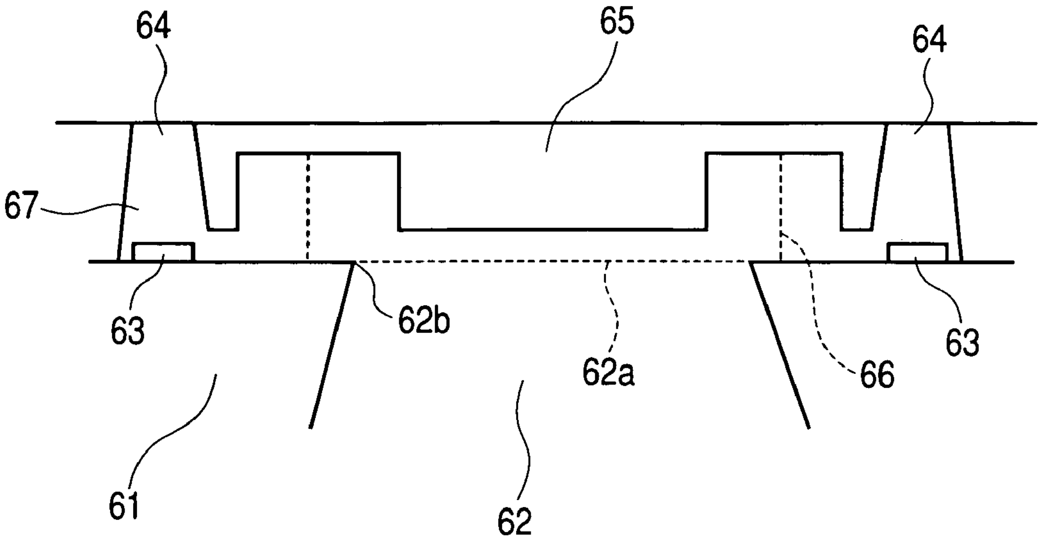
FIG. 8A is a vertical cross sectional view showing a nozzle structure of an ink jet head with an improved strength according to the production method of the present invention and FIG. 8B is a vertical cross sectional view showing a nozzle structure as compared with the head as shown in FIG. 8A.
Figure 8B:
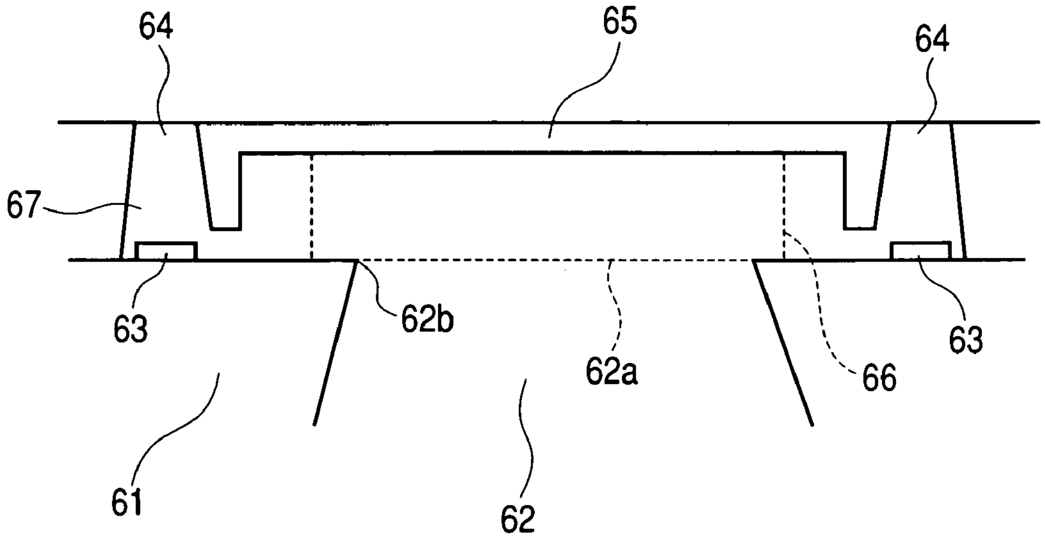

Next, as shown in FIG. 8A, the head according to a third embodiment of the present invention is characterized in that the height of a liquid flow path made of liquid flow path forming material 65 corresponding to the center portion of an ink supply hole 62 is lower than that of a liquid flow path corresponding to an opening circumferential portion 62*b* of the ink supply hole 62. FIG. 8B shows a liquid flow path shape as compared with the third embodiment. In the configuration of the head described referring to FIG. 6A, in case that the height of the liquid flow path from the end 42*a* of the ink supply hole 42 to the discharge chambers 47 becomes higher, as shown in FIG. 8B, there is a risk that a coating thickness of the liquid flow path forming material 65 corresponding to the ink supply hole 62 becomes smaller and the reliability of the ink jet head is greatly lowered. For example, in case that a jam occurs during recording, it is assumed that the coating forming the liquid flow path forming material 65 may be torn to thus leak ink.

However, in this method, as shown in FIG. 8A, the aforementioned bad effect can be avoided by thickening the liquid flow path 65 corresponding to almost the overall opening of the ink supply hole 62 and increasing the height of the flow path only on the portion corresponding to the portions near the opening circumferential portion 62*b* of the ink supply hole 62 required for supplying ink. The distance from the ink supply hole opening circumferential portion 62*b* to the portion on which the height of the flow path is made higher by the liquid flow path forming material 65 is determined according to a discharge amount of an ink jet head to be designed or an ink viscosity, preferably, 10 to 100 $\mu$m in general.

Figure 9A:
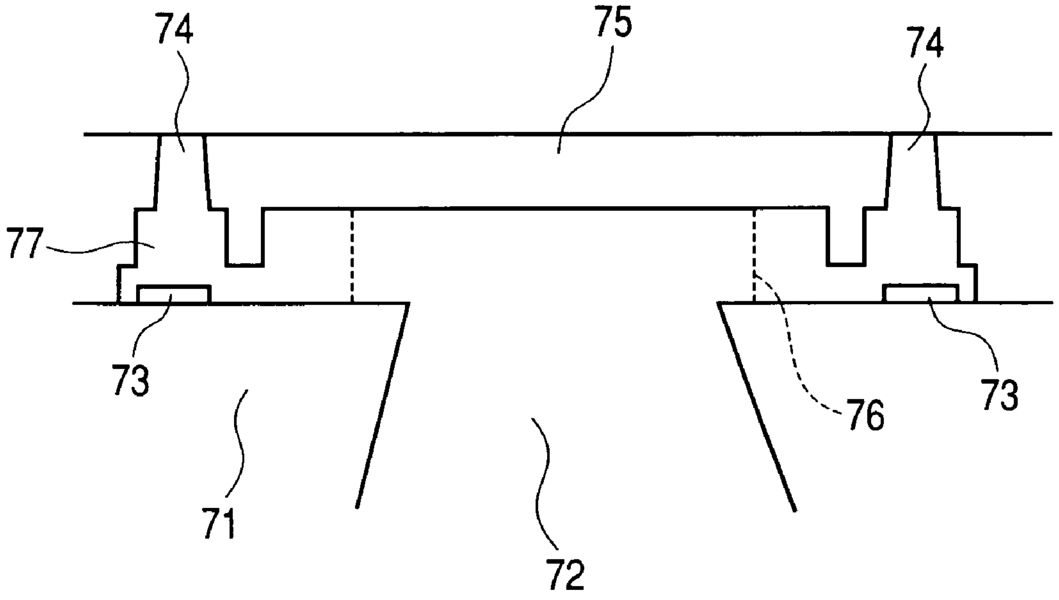
FIG. 9A is a vertical cross sectional view showing a nozzle structure of an ink jet head with improved discharge chamber according to the production method of the present invention and FIG. 9B is a vertical cross sectional view showing a nozzle structure as compared with the head as shown in FIG. 9A.
Figure 9B:
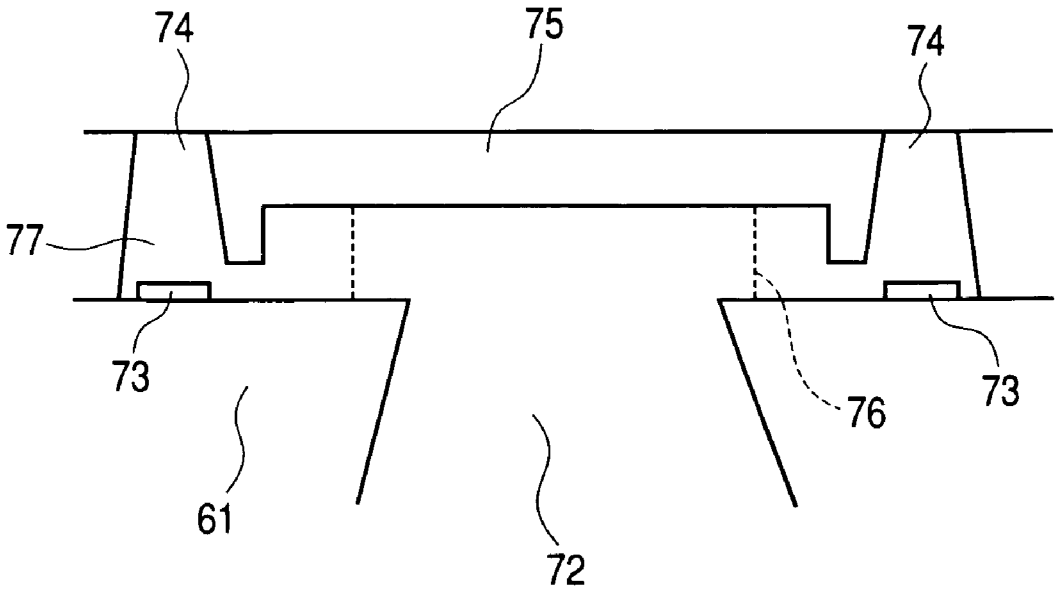

Next, as shown in FIG. 9A, the head according to a fourth embodiment of the present invention is characterized in that a discharge port of a discharge chamber 77 has a convex sectional shape. FIG. 9B shows a discharge port shape of a discharge chamber as compared with the fourth embodiment of the present invention. The discharge energy of ink is greatly changed by the flow resistance of ink defined by the shape of a discharge port of the upper portion of a heater. In a conventional method, the shape of a discharge shape is formed by patterning a liquid flow path forming material, thus it becomes a shape on which a discharge port pattern formed on a mask is projected. Hence, in principle, a discharge port is penetrated through the liquid flow path forming material layer and formed with the same area to the opening of a discharge port of the surface of the liquid flow path forming material. However, according to the method of the present invention, a discharge port of the discharge chamber 77 can be formed in a convex shape by changing the shape of the pattern of the upper layer material and the lower layer material. This is effective to increase ink discharge speed, increase the forwarding property of ink and provide a recording head capable of carrying out the recording process with a higher quality.

EXAMPLES

The present invention is described in detail, by reference to drawings as necessary.

Example 1

FIGS. 10 to 19 show an example of the construction and the production steps of the liquid jet recording head of the present invention, respectively. Although the liquid jet recording head has two orifices (discharge ports) is disclosed in this example, it will be understood to those skilled in related art that the construction and the production process may be applied to the case of a high density multi-array liquid-jet recording head having two or more orifices. In addition, FIGS. 10 to 19 schematically show the correlation of a first positive photosensitive material layer and a second positive photosensitive material layer regarding these essential portions. Other additional structures are not specially described herewith.

Figure 10:
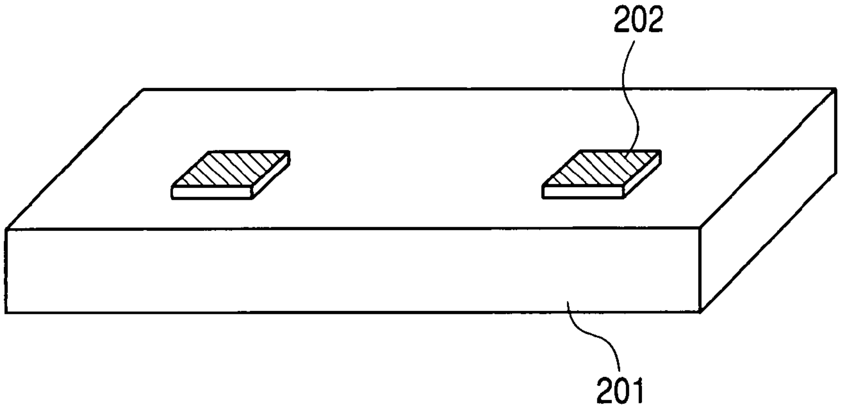
FIG. 10 is a schematic perspective view for illustrating a production method according to a first embodiment of the present invention.
Figure 11:
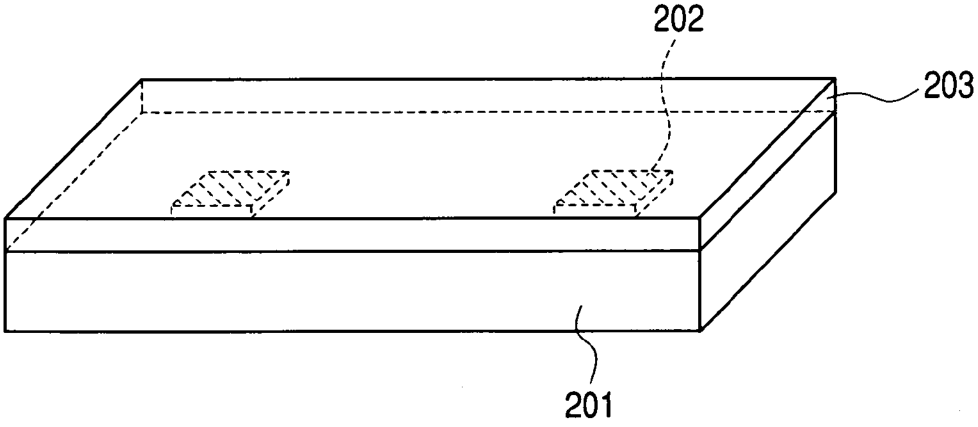
FIG. 11 is a schematic perspective view for illustrating the next process of a production state as shown in FIG. 10.

In this example, a substrate 201 employed is made of glass, ceramic, plastic, metal, or the like as shown in FIG. 10 which is a schematic perspective view of a substrate before formation of a photosensitive material layer.

The substrate 201 is not specially limited in its shape, material, and so forth, provided that it is capable of being a part of the liquid flow path forming materials and capable of acting as a supporting member to support the liquid flow path forming material composed of the photosensitive material layer, which will be described later. Plural liquid discharge energy generation elements 202 such as electrothermal transducers, piezoelectric elements, or the like are provided as desired on the substrate 201 (two elements in FIG. 10). The liquid discharge energy generation elements 202 apply energy to an ink to discharge recording liquid droplets and conduct recording process. For example, an electrothermal transducer employed as the discharge energy generating element 202 heats the recording liquid around it to apply discharging energy; and a piezoelectric element employed as the discharge energy generation element 202 generates the discharging energy by mechanical vibration of the element.

To the elements 202, control signal input electrodes (not shown in the drawings) are connected to drive the elements. Generally, the element has a functional layer such as a protecting layer to improve durability of the discharge energy generation elements 202. In the present invention also, such a functional layer may naturally be provided without inconvenience.

Most generally, as the substrate 201, silicon is employed. That is, since a driver or logic circuit for controlling a discharge energy generating element is produced by a general semiconductor production method, silicon is preferably applied to the substrate. In addition, as a method for forming a through hole for supplying ink to the silicon substrate, techniques such as YAG laser working or sand blasting may be employed. However, in case that a thermally crosslinkable resist is applied as a lower layer material, a prebaking temperature of this resist is very high as described above and exceeds a glass transition temperature of resin by a great extent, thereby making a resin coating fall into the through hole during prebaking. Hence, it is preferable that no through hole is formed on the substrate during the coating of resist. To such a method, anisotropic etching technique of silicon by an alkali solution can be applied. In this case, preferably, a mask pattern is formed on the back surface of the substrate using an alkali resistant silicon nitride, and a membrane film forming an etching stopper is formed on the surface of the front substrate using the same material.

Furthermore, as shown in FIG. 10, a crosslinkable positive type resist layer 203 is formed on the substrate 201 containing the liquid discharge energy generation element 202. This material is a copolymer composed of methyl methacrylate, methacrylic acid and methacrylate anhydride in a ratio of 70:15:15. Here, P(MMA-MAA-MAN) which is a thermally crosslinkable positive resist forming a lower layer has an absorption sensitivity around a region of 210 to 260 nm, and PMIPK which is a positive resist forming an upper layer has an absorption sensitivity around a region of 260 to 330 nm. In this way, due to a difference of absorption spectrums of materials forming the upper and lower layers, a convex pattern of resist can be formed by selectively changing a wavelength band upon exposure. These resin particles are dissolved in cyclohexanone at a concentration of 30 wt % and then is used as a resist solution. This resist solution is spreading over the above-mentioned substrate 201 to coat it, prebaked in an oven for 60 minutes at 200° C. and then thermally crosslinked. The obtained resist film had a thickness of 10 $\mu$m.

Figure 22:
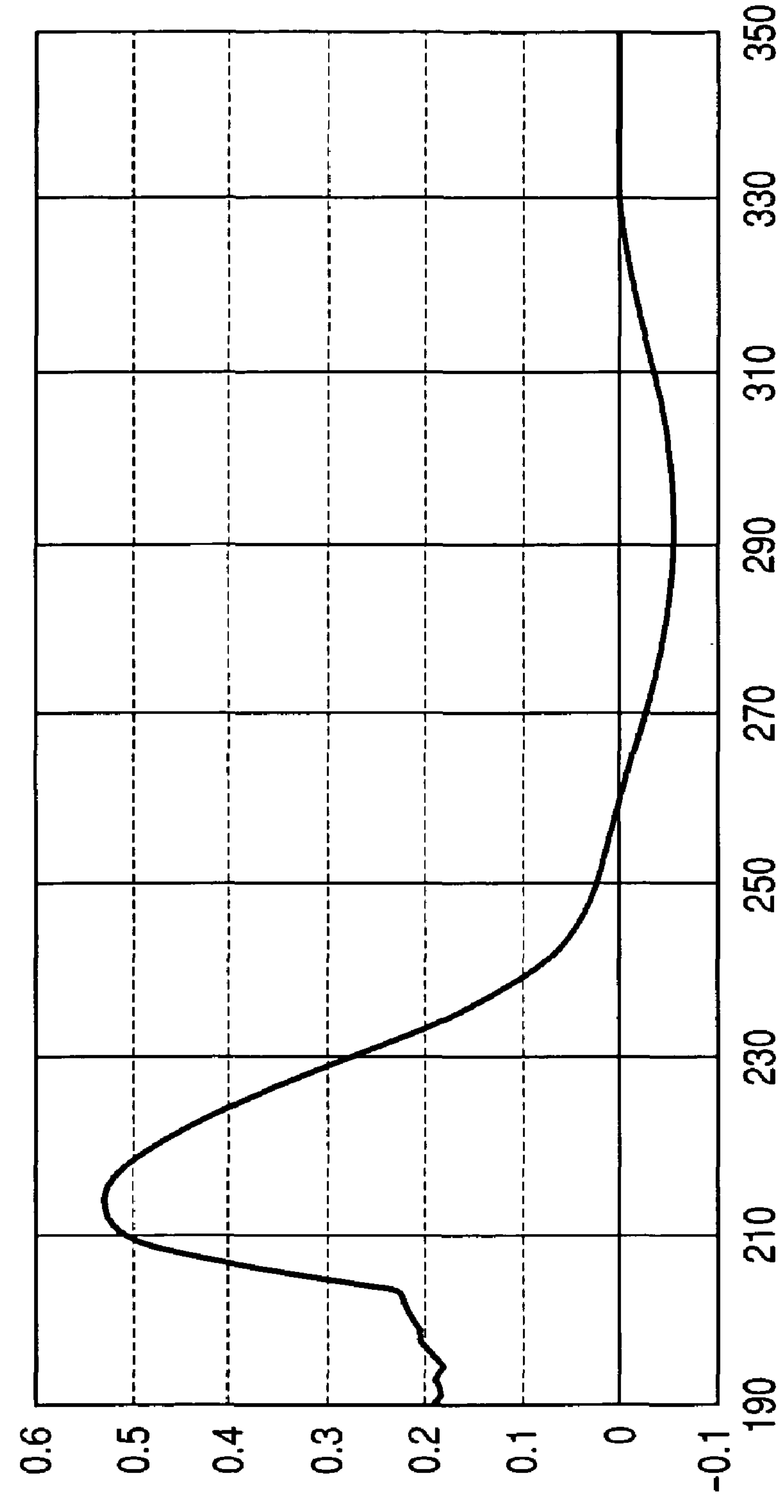
FIG. 22 is a view showing an absorption wavelength region of a copolymer (P(MMA-MAA-GMA)) of methyl methacrylate, methacrylic acid and glycidyl methacrylate.

Other preferred specific examples of a ternary copolymer include:

(1) a copolymer of methyl methacrylate, methacrylic acid, methacrylate anhydride and glycidyl methacrylate having a ratio of 80:5:15, with an weight average molecular weight (Mw) of 34,000, an average molecular weight (Mn) of 11,000 and a dispersion (Mw/Mn) of 3.09 (its absorption spectrum being shown in FIG. 22).

Figure 23:
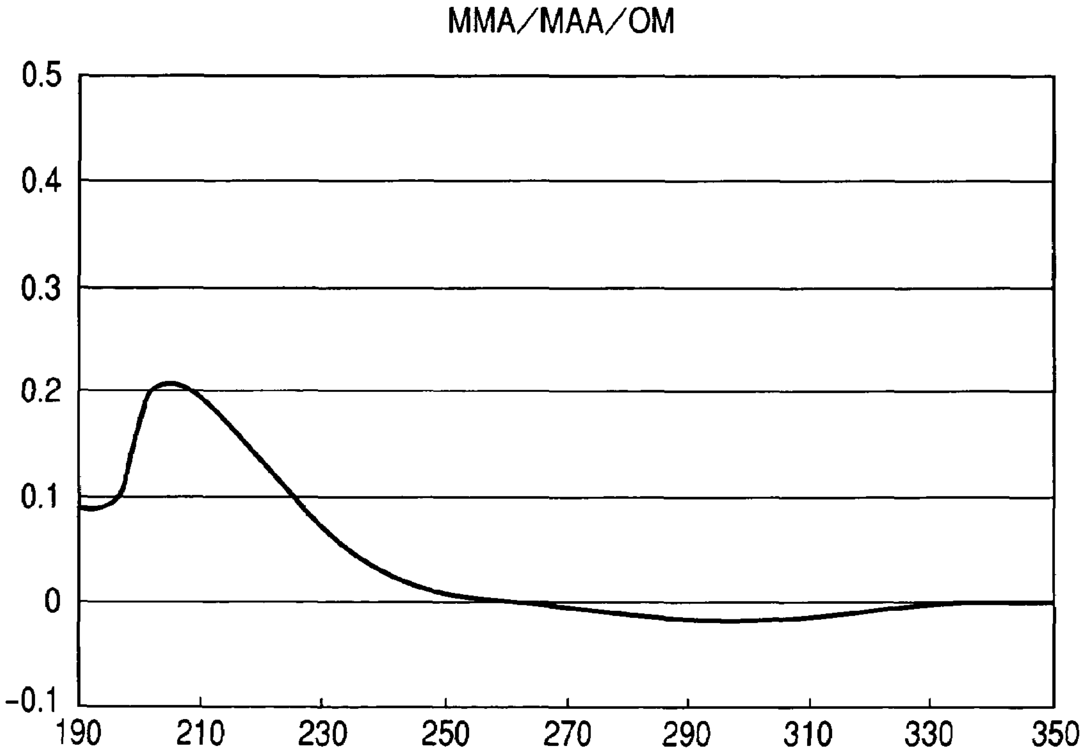
FIG. 23 is a view showing an absorption wavelength region of a copolymer (P(MMA-MAA-OM)) of methyl methacrylate, methacrylic acid and 3-oxyimino-2-butanon methyl methacrylate.
Figure 24:
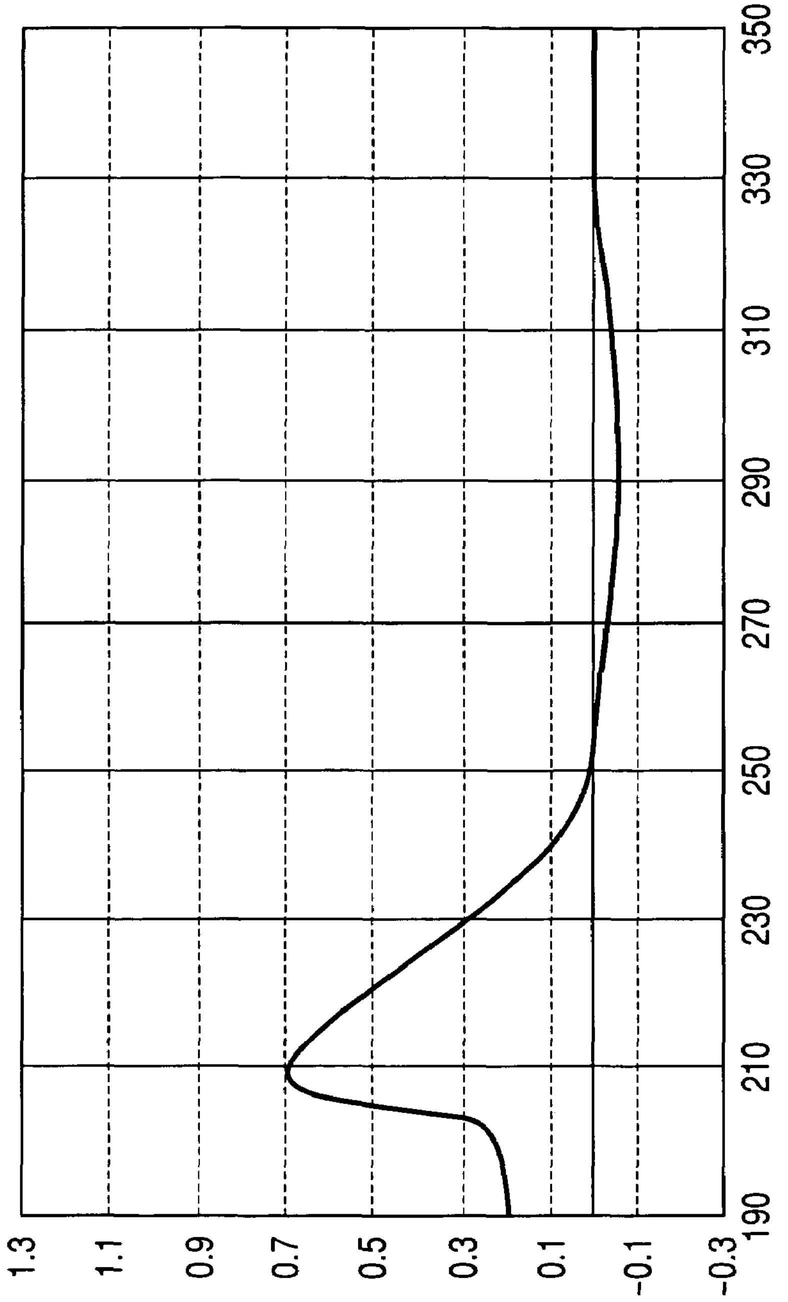
FIG. 24 is a view showing an absorption wavelength region of a copolymer (P(MMA-MAA-methacrylonitrile)) of methyl methacrylate, methacrylic acid and methacrylonitrile.

(2) a copolymer of methyl methacrylate, methacrylic acid and 3-oxyimino-2-butanon methyl methacrylate having a ratio of 85:5:10, with an weight average molecular weight (Mw) of 35,000, an average molecular weight (Mn) of 13,000 and a dispersion (Mw/Mn) of 2.69. Here, an absorption spectrum of a thermally crosslinkable positive resist forming a pattern material is shown in FIG. 23.

Figure 25:
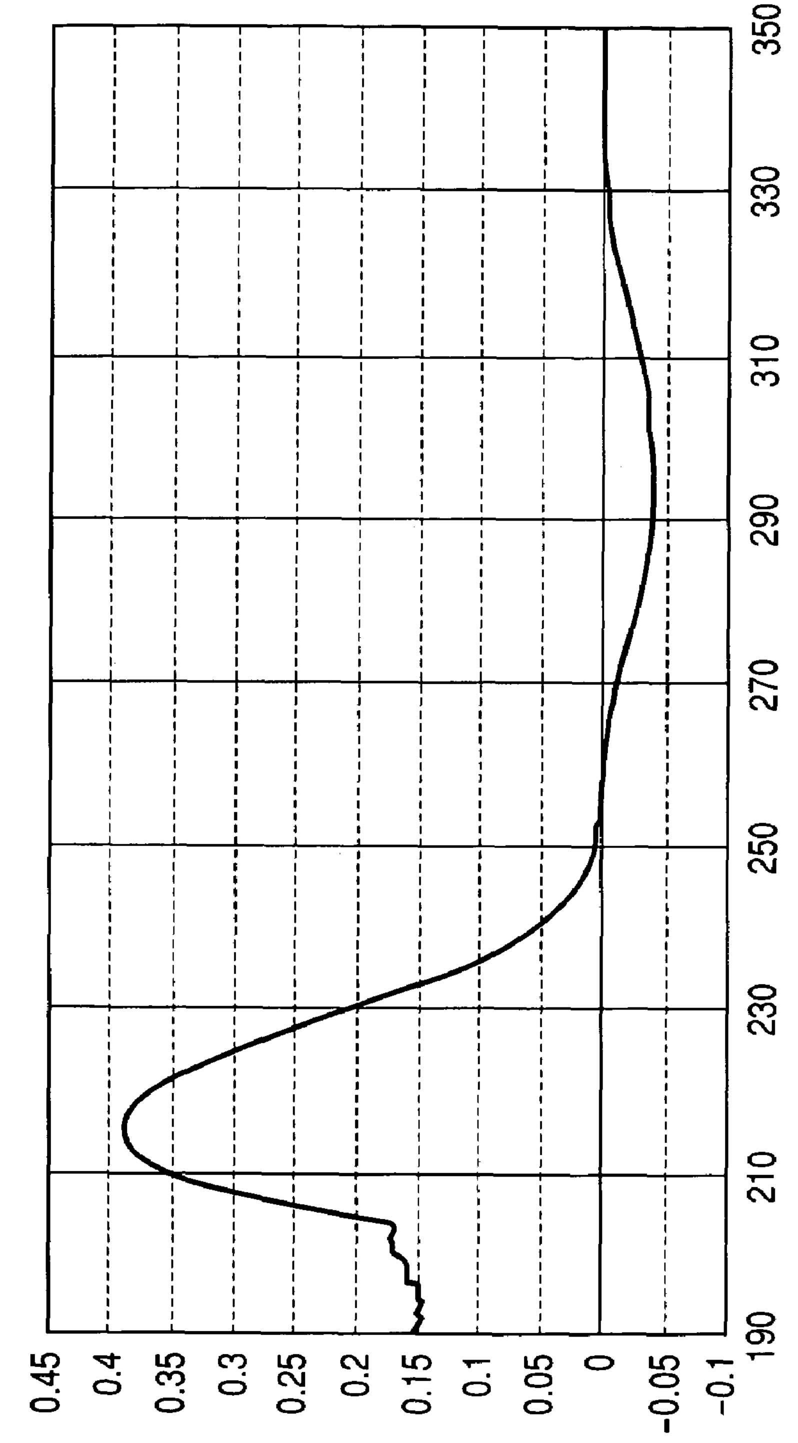
FIG. 25 is a view showing an absorption wavelength region of a copolymer (P(MMA-MAA-furmaric acid anhydride)) of methyl methacrylate, methacrylic acid and furmaric acid anhydride.

(3) a copolymer of methyl methacrylate, methacrylic acid and methacrylonitril having a ratio of 75:5:20, with an weight average molecular weight (Mw) of 30,000, an average molecular weight (Mn) of 16,000 and a dispersion (Mw/Mn) of 1.88 (its absorption spectrum being shown in FIG. 25).

(4) a copolymer of methyl methacrylate, methacrylic acid and anhydrous fumaric acid having a ratio of 80:5:15, with an weight average molecular weight (Mw) of 30,000, an average molecular weight (Mn) of 14,000 and a dispersion. (Mw/Mn) of 2.14 (its absorption spectrum being shown in FIG. 25).

Figure 12:
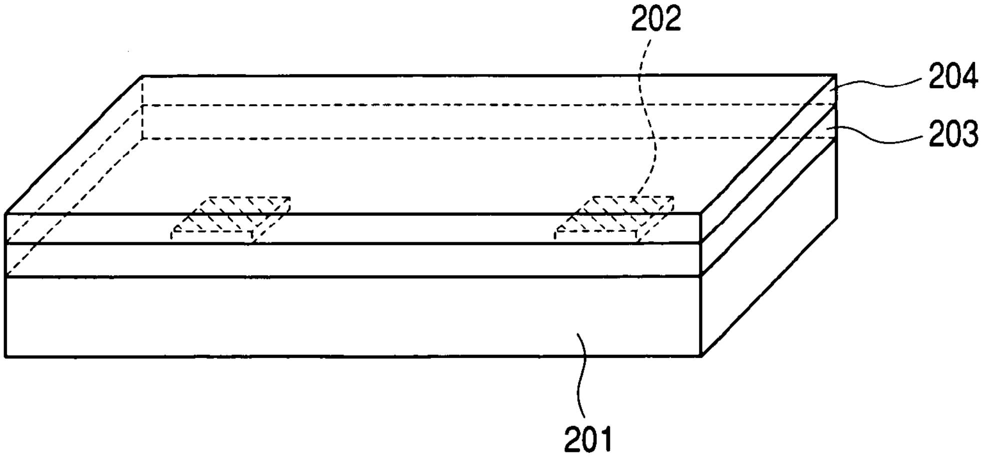
FIG. 12 is a schematic perspective view for illustrating the next process of a production state as shown in FIG. 11.

Next, as shown in FIG. 12, a positive type resist layer 204 of PMIPK is coated over the thermally crosslinkable positive resist layer 203. As the PMIPK, ODUR-1010 (produced by Tokyo Ohka Kogyo Co., Ltd.) is used after being adjusted to have a resin concentration of 20 wt %. Prebaking is carried out on a hot plate for six minutes at 120° C. The obtained resin film had a thickness of 10 $\mu$m.

Figure 13:
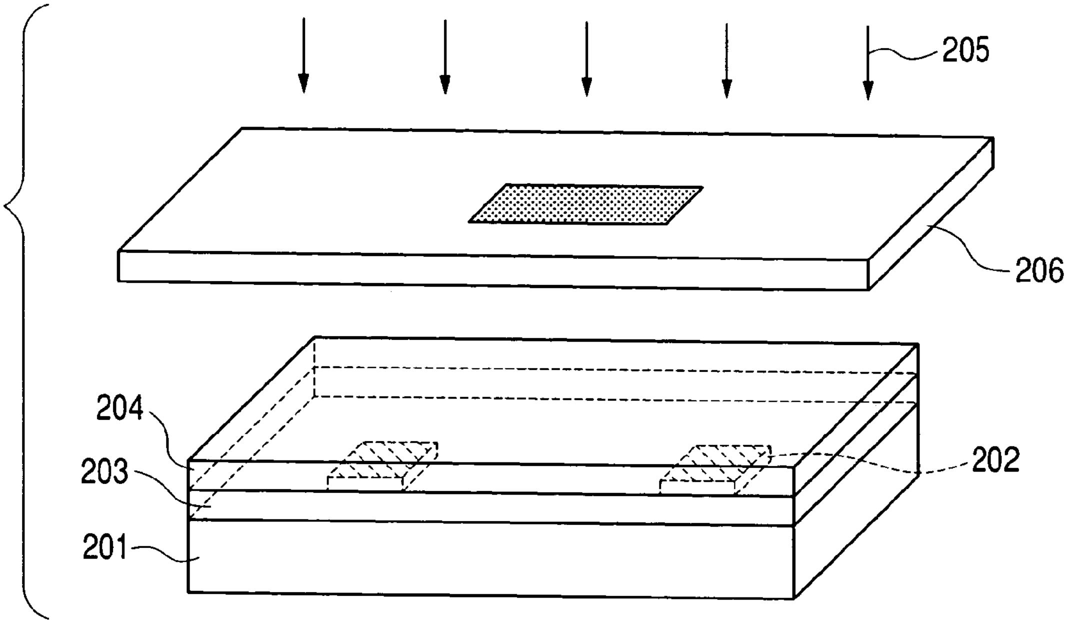
FIG. 13 is a schematic perspective view for illustrating the next process of a production state as shown in FIG. 12.

Also, as shown in FIG. 13, the exposure of the positive resist layer 204 of PMIPK is conducted by any commonly available exposure apparatus. Particularly, the apparatus used in the present invention is a deep UV exposure apparatus, UX-3000SC, produced by Ushio Electric Co., and is mounted with a cut filter for cutting off light of 260 nm or less as shown in FIG. 3, and then the exposure is conducted in a 260 to 330 nm band region which is same to the second wavelength band as shown in FIG. 4. An exposure amount is 10 J/$cm^2$. The exposure is conducted through a photomask 206 drawing a pattern for leaving ionizing radiation 205 to the PMIPK.

Figure 14:
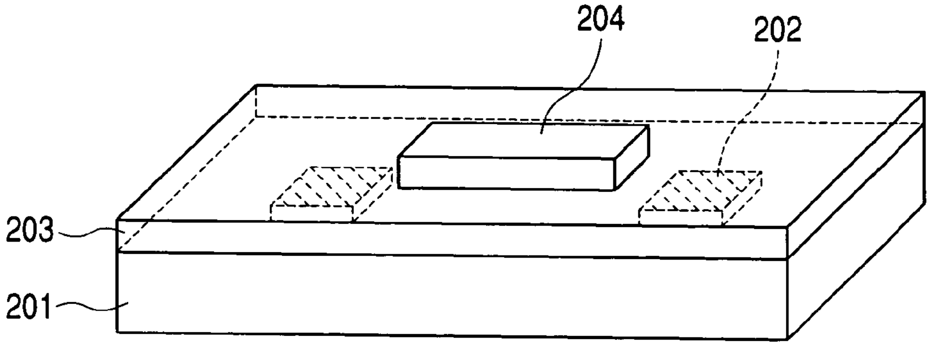
FIG. 14 is a schematic perspective view for illustrating the next process of a production state as shown in FIG. 13.

Subsequently, as shown in FIG. 14, the development of the positive resist layer 204 of PMIPK is conducted to form a pattern. The development is conducted by immersing the resist layer in methylisobutylketone for one minute.

Figure 15:
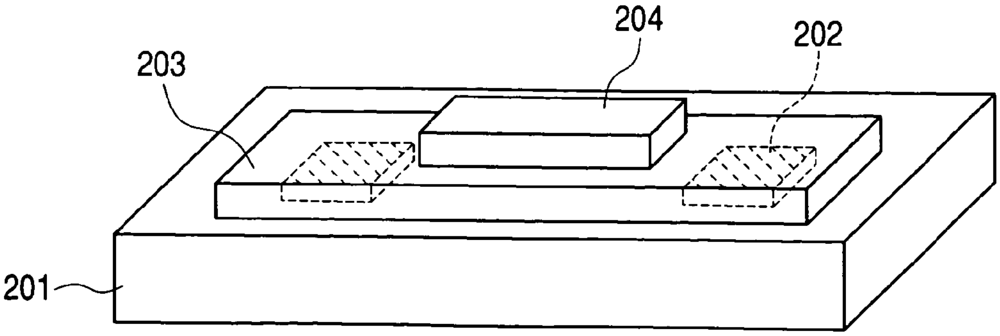
FIG. 15 is a schematic perspective view for illustrating the next process of a production state as shown in FIG. 14.

Also, as shown in FIG. 15, the patterning process (exposure, development) of the lower thermally crosslinkable positive resist layer 203 is carried out. The same exposure apparatus as stated above is used and the patterning is conducted in a 210 to 330 nm band region which is the same first wavelength region as shown in FIG. 5. An exposure amount is 35 J/$cm^2$. Development is carried out with methylisobutyl ketone. The exposure is conducted through a photomask (not shown) drawing a pattern for leaving ionizing radiation to the thermally crosslinkable positive resist. At this time, since the PMIPK pattern of the upper layer becomes thinner by a diffraction light from the mask, a PMIPK remaining portion is designed with such a thinning effect being added thereto. Naturally, in case that an exposure apparatus having a projection optical system with no effect of the diffraction light, there is no need to conduct a mask design to which the thinning effect is added.

Figure 16:
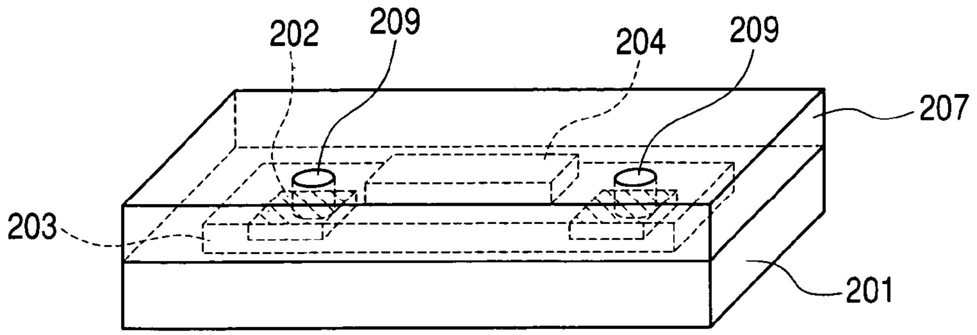
FIG. 16 is a schematic perspective view for illustrating the next process of a production state as shown in FIG. 15.

Additionally, as shown in FIG. 16, in order to cover the patterned lower thermally crosslinkable positive resist layer 203 and upper positive resist layer 204, a layer of liquid flow path forming material 207 is formed. The material of this layer is produced by dissolving 50 parts by weight of EHPE-3150 commercially available by Daicel Chemical Industries, Ltd., one part by weight of Photocation polymerization initiator SP-172 produced by Asahi Denka Co., Ltd. and 2.5 parts by weight of silane coupling agent A-187 commercially available by Nihonunica Corporation in 50 parts by weight of xylene used as a coating solvent.

The coating is conducted by spin coating and prebaking is conducted on a hot plate for three minutes at 90° C. In addition, to the liquid flow path forming material 207, conducted is the pattern exposure and development of an ink discharge port 209. This pattern exposure may be conducted by any one of general exposure apparatuses. Though not shown in the drawings, a mask is used during exposure which does not irradiate light to the portion forming the ink discharge port. The exposure is conducted with a Canon MPA-600 Super mask aligner, with an exposure dose of 500 mJ/$cm^2$. The development is conducted by immersing in xylene for 60 seconds. Afterwards, one hour baking is conducted at 100° C. to increase the contactability of the liquid flow path forming material.

Thereafter, though not shown in the drawings, the liquid flow path forming material layer is coated with a cyclic isoprene to protect this material layer from an alkali solution. As this material, the cyclic isoprene manufactured and sold by Tokyo Ohka Kogyo Co., Ltd. under a trade name of OBC is used. Afterwards, the silicon substrate is immersed in a 22 wt % tetramethyl ammonium hydroxide (TMAH) solution for 14.5 hours at 83° C., and a through hole (not shown) for supplying ink is formed. In addition, silicon nitride used as a mask and a membrane is previously patterned on the silicon substrate to form an ink supply opening. After the anisotropic etching, the silicon substrate is mounted to a dry etching device in such a manner that the back surface can be upside, and the membrane film is removed by an etchant made by mixing 5% oxygen to $CF_4$. Next, the silicon substrate is immersed in xylene to remove the OBC.

Figure 17:
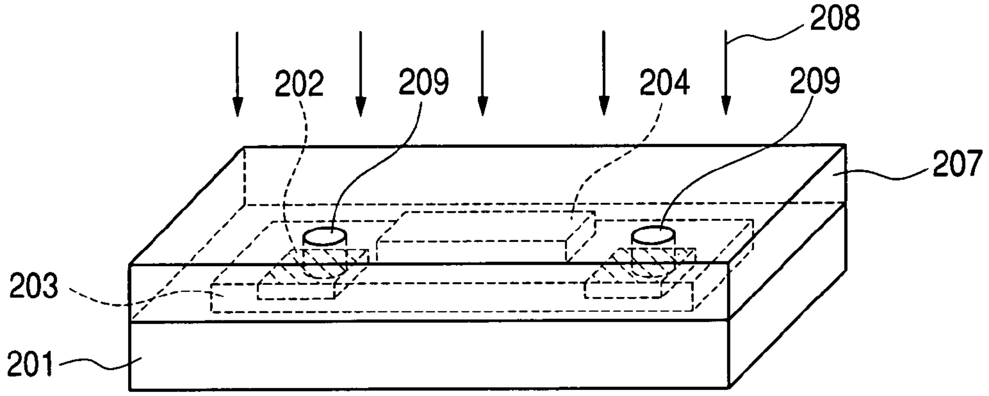
FIG. 17 is a schematic perspective view for illustrating the next process of a production state as shown in FIG. 16.

Next, as shown in FIG. 17, ionizing radiation 208 of 210 to 330 nm region band entirely irradiates to the liquid flow path forming material 207 using a low temperature mercury. Then, the upper positive resist layer of PMIPK and the lower thermally crosslinkable positive resist layer are decomposed. An irradiation dose is 81 J/$cm^2$.

Figure 18:
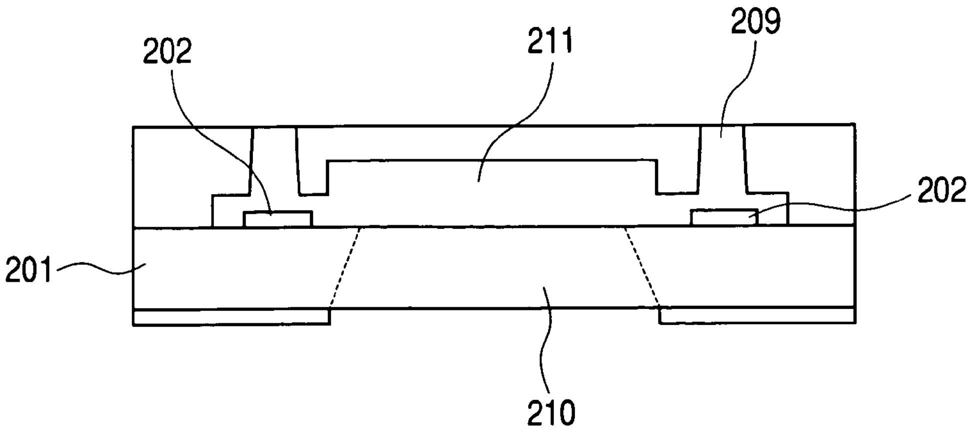
FIG. 18 is a schematic perspective view for illustrating the next process of a production state as shown in FIG. 17.

Thereafter, the substrate 201 is immersed in lactic acid methyl to remove the resist pattern in overall as shown in the vertical sectional view of FIG. 18. At this time, the substrate 201 is put into a megasonic bath of 200 MHz to promote a decrease in dissolution time period. Hence, liquid flow paths 211 including discharge chambers are formed, and ink is introduced into each of the discharge chambers via each liquid flow path 211 from an ink supply opening 210, thereby producing an ink discharge element having a structure of discharging ink from a discharge port 209 by a heater.

Figure 19:
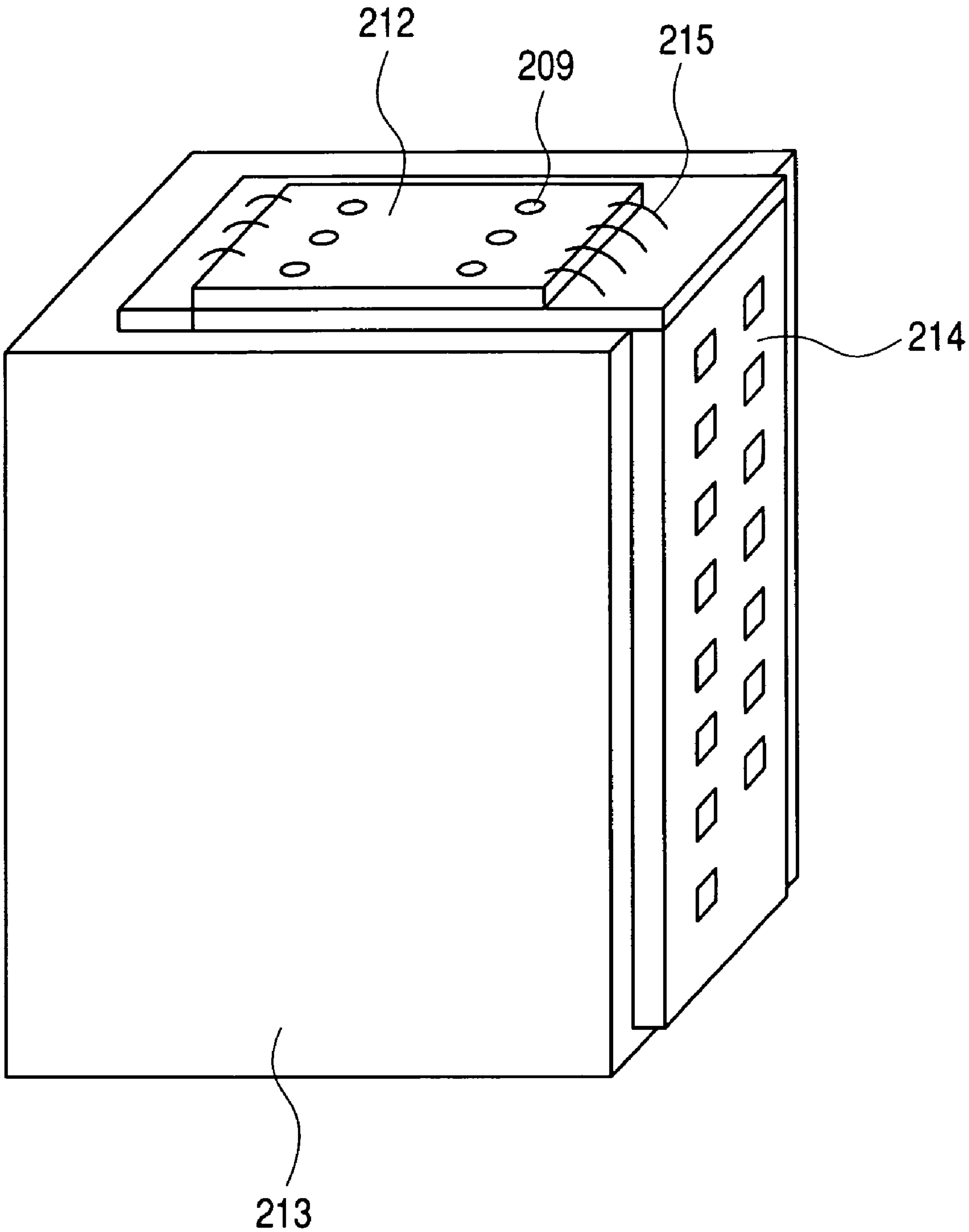
FIG. 19 is a schematic perspective view illustrating an ink jet head having an ink discharge element obtained by the production method as shown in FIGS. 10, 11, 12, 13, 14, 15, 16, 17 and 18.

The produced discharge element is mounted on an ink jet head unit of such a shape as shown in FIG. 19. As a result of evaluation of discharging and recording, it is found that a good image recording process can be performed. As shown in FIG. 19, the above-mentioned ink jet head unit has such a construction, for example, that a TAB film 214 for transmitting and receiving a recording signal to/from a recording apparatus main body is formed on the outer surface of a supporting member for detachably supporting the ink tank 213. An ink discharge element 212 on the TAB film 214 is connected to an electric wire by an electric connecting lead 215.

Example 2

According to the method of the first example, an ink jet head having a structure as shown in FIG. 6A is produced. As shown in FIG. 20, the ink jet head has a horizontal distance of 100 $\mu$m from an opening circumferential portion 42*a* of an ink supply opening 42 to one end 47*a* of the ink supply opening of the discharge chamber 47. A liquid flow path wall 46 is formed to the portion having a distance of 60 $\mu$m from the end 47_a_ of the ink supply opening of the discharge chamber 47, and divides the discharge elements into each. In addition, the height of the liquid flow path is 10 μm from the end 47_a_ of the ink supply opening of the discharge chamber 47 to the ink supply opening 42, and the height of the other portions is 20 μm. The distance from the surface of the substrate 41 to the surface of the liquid flow path forming material 45 is 26 μm.

Figure 20A:
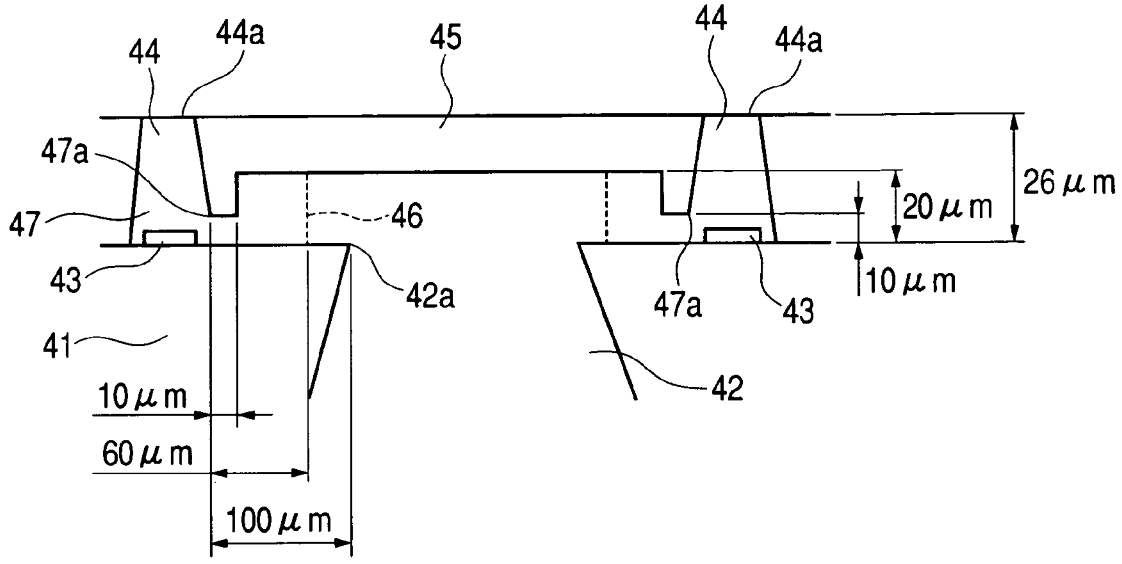
FIGS. 20A and 20B are views showing a nozzle structure of a head produced in order to compare the ink refilling property of the production method of present invention with that of the conventional production method.
Figure 20B:
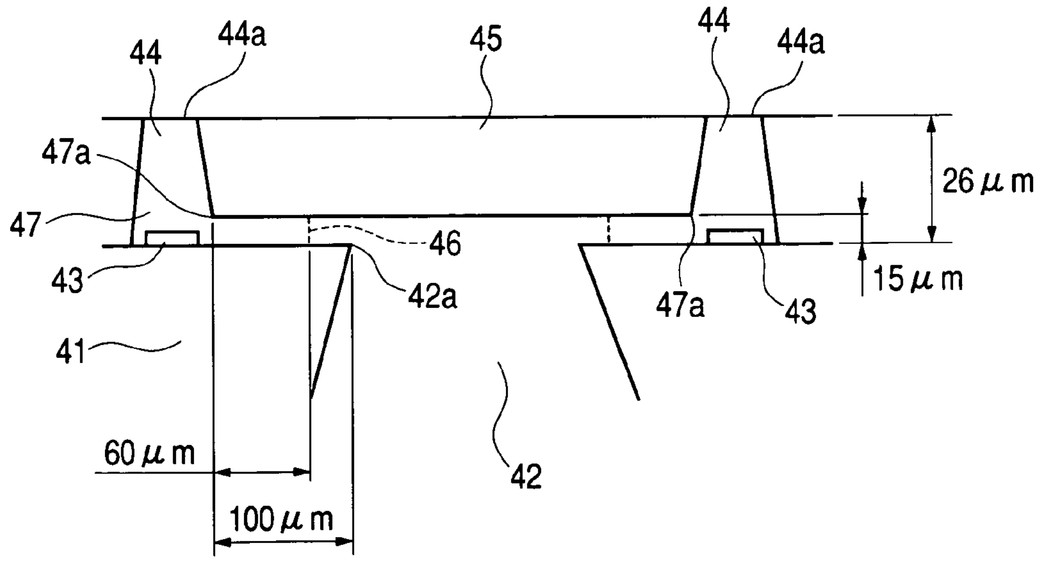

FIG. 20B shows a cross section of a flow path of an ink jet head according to a conventional method. This head has a liquid flow path height of 15 μm throughout the overall areas.

As a result of measuring a refill speed after the discharge of ink of each head of FIGS. 20A and 20B, a flow path structure of FIG. 20A shows a refill speed of 45 μsec. and a flow path structure of FIG. 20B shows a refill speed of 25 μsec. According to the ink jet head according to this example, it is turned out that the refill of ink is conducted at a very high speed.

Example 3

According to the method of the first example, a head having a nozzle filter as shown in FIG. 7A is manufactured for trial.

Referring to FIG. 7A, a nozzle filter 58 is configured by forming columns with a diameter of 3 μm at a portion spaced 20 μm from the opening circumferential portion of an ink supply opening 52 toward discharge chambers 57. The gap between the columns constituting the nozzle filter is 10 μm. A nozzle filter 59 according to a conventional method as shown in FIG. 7B has the same location and shape but is different from the nozzle filter of this example since it reaches up to the substrate 51.

Each of the heads in FIGS. 7A and 7B are manufactured for trial, and then an ink refill speed is measured after the discharging of ink. As a result, a filter structure of FIG. 7A shows a refill speed of 58 μsec. and a filter structure of FIG. 7B shows a refill speed of 65 μsec. According to the ink jet head according to this example, it is turned out that the refill time of ink can be reduced.

Example 4

According to the method of the first example, an ink jet head having a structure as shown in FIG. 8A is manufactured for trial.

Referring to FIG. 8A, a liquid flow path corresponding to an ink supply opening 62 has a height of 30 μm from an opening circumferential portion 62_b_ of an ink supply opening 62 toward the center portion of the supply opening. The layer thickness of a liquid flow path forming material 65 is 6 μm. Besides this portion, in the height of the liquid flow path corresponding to the ink supply opening 62, the layer thickness of the liquid flow path forming material 65 is 16 μm. The ink supply opening 62 has a width of 200 μm and a length of 14 mm.

In the head as shown in FIG. 8B, the layer thickness of the portion corresponding to the ink supply opening 62 of the liquid flow path forming material 65 is 6 μm.

Each of the heads of FIGS. 8A and 8B are manufactured for trial, and a drop test of the heads is conducted at a height of 90 cm. As a result, the head structure of FIG. 8B shows a crack occurrence on the liquid flow path structure material 65 in 9 of 10 heads, while the head structure of FIG. 8A shows no crack in any of 10 heads.

Example 5

According to the method of the first example, an ink jet head having a structure as shown in FIG. 9A is manufactured for trial.

Figure 21A:
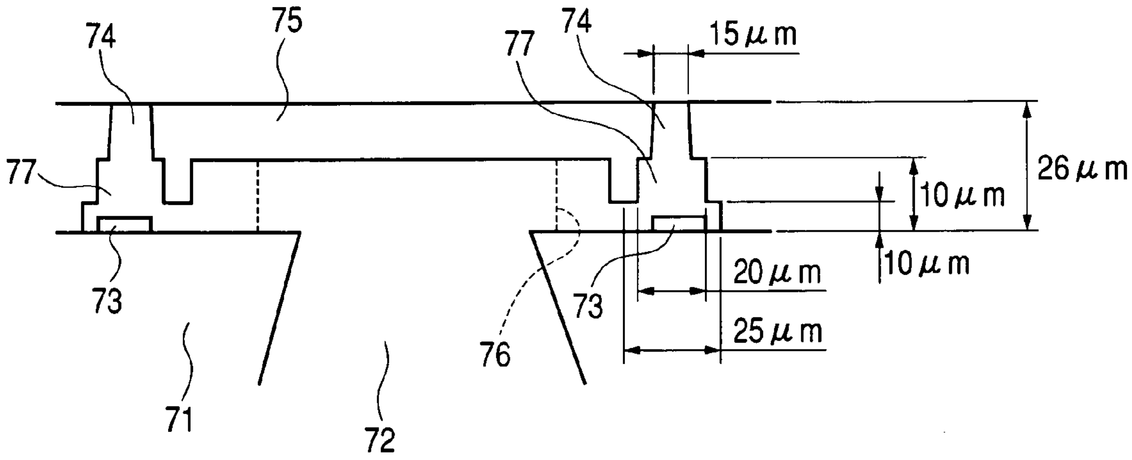
FIGS. 21A and 21B are views showing a nozzle structure of a head produced in order to compare the discharge characteristics of the production method of the present invention with those of the conventional production method.

In this example, as shown in FIG. 21A, discharge chambers 77 are constructed in such a manner that a rectangular portion made of a lower layer resist is a 25 μm square having a height of 10 μm, a rectangular portion made of an upper layer resist is a 20 μm square having a height of 10 μm and a discharge port is a round hole having a diameter of 15 μm. The distance from the heater 73 to the opening surface of the discharge port 74 is 26 μm.

Figure 21B:
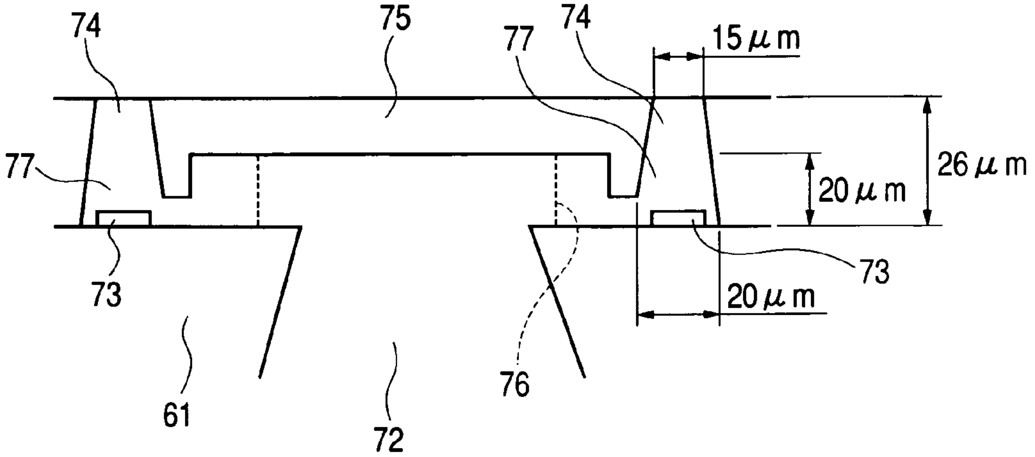

FIG. 21B shows a sectional shape of a discharge port of a head according to a conventional method. The discharge chamber is a rectangular in which one side is 20 μm and a height is 20 μm. The discharge port 74 is formed of a round hole having a diameter of 15 μm.

As a result of comparison of the discharge characteristics of the heads of FIGS. 21A and 21B, the head as shown in FIG. 21A has a discharge amount of 3 ng, a discharge speed of 15 m/sec and an impact precision of 3 μm at a position spaced 1 mm from the discharge port 74 in a discharge direction. In addition, the head as shown in FIG. 21B has a discharge amount of 3 ng, a discharge speed of 9 m/sec and an impact precision of 5 μm.

Example 6

First, a substrate 201 is prepared. Most generally, as the substrate 201, a silicon substrate is applied. Generally, a driver or logic circuit for controlling a discharge energy generation element is produced by a general semiconductor manufacture method, silicon is preferably applied to this substrate. In this example, there is prepared an electrothermal converting element (heater made of $HfB_2$ material) as an ink discharge pressure generation element 202 and a silicon substrate having an ink flow path and a lamination film (not shown) of SiN+Ta on a nozzle forming portion (FIG. 2).

Following to the above, as shown in FIG. 3, on the substrate (FIG. 2) including the ink discharge pressure generation element 202, a first positive resist layer 203 is formed. As the first positive resist, the following photodegradation type positive resists are used.

Radical polymer of anhydrous methacrylate

Weight average molecular weight (Mw: polystyrene conversion)=25,000

Dispersion (Mw/Mn)=2.3

This resin powder is dissolved in cyclohexanone at a solids concentration of about 30 wt % and is used as a resist solution. The viscosity of the resist solution is 630 cps. This resist solution is coated by spin coating, prebaked for three minutes at 120° C. and heat treated under a nitrogen atmosphere in an oven for 60 minutes at 250° C. The film thickness of the resist layer after the heat treatment is 10 μm.

Next, as a first positive resist layer 204, polymethyl isopropenyl ketone (ODUR produced by Tokyo Oka Co.) is spin coated and baked for three minutes at 120° C. The film thickness of the resist layer after the baking is 10 μm.

Continually, the patterning of a second positive resist layer is conducted. As an exposure apparatus, a deep UV exposure apparatus, UX-3000SC, manufactured by Ushio Electric Co. is used, and is mounted with a cut filter for cutting off light of 260 nm or less. The pattern is exposed at an exposure does of 3,000 $mJ/cm^2$, developed with methylisobutylketone, rinsed with isopropyl alcohol to form a second flow path pattern.

Successively, the patterning of the first positive resist layer is conducted. Using the same exposure apparatus as described above, an optical filter for cutting off the light of a wavelength of more than 270 nm is mounted. The pattern is exposed at an exposure does of 10,000 mJ/cm$^2$, developed with the following developing solution, rinsed with isopropyl alcohol to form a second flow path pattern.

| Developing solution | |
|---|---|
| Diethylenglycolmonobutylether | 60 vol % |
| Ethanolamine | 5 vol % |
| Morpholine | 20 vol % |
| Ion exchange water | 15 vol % |

Next, on the processed substrate, spin coating is conducted using a photosensitive resin composition composed of the following compositions (film thickness: 20 μm on a flat plate) and baked on a hot plate for two minutes at 100° C. to form a liquid flow path forming material 207.

| | |
|---|---|
| EHPE (produced by Daicel Chemical Ind., Ltd.) | 100 parts by weight |
| 1,4-HFAB (produced. by Central Glass Co., Ltd.) | 20 parts by weight |
| SP-170 (produced by Asahi Denka Kogyo K.K.) | 2 parts by weight |
| A-187 (produced by Nippon Unicar Co., Ltd.) | 5 parts by weight |
| Methylisobutylketone | 100 parts by weight |
| Diglyme | 100 parts by weight |

Next, on the processed substrate, a photosensitive resin composition composed of the following compositions is coated by spin coating to have a film thickness of 1 μm and baked on a hot plate for three minutes at 80° C. to form an ink-repellent agent layer.

| | |
|---|---|
| EHPE-3158 (produced by Daicel Chemical Ind., Ltd.) | 35 parts by weight |
| 2,2-bis(4-glycidyloxyphenyl)hexafluoropropane | 25 parts by weight |
| 1,4-bis(2-hydroxyhexafluoroisopropyl)benzene | 25 parts by weight |
| 3-(2-perfluorohexyl)ethoxy-1,2-epoxypropane | 16 parts by weight |
| A-187 (produced by Nippon Unicar Co., Ltd.) | 4 parts by weight |
| SP-170 (produced by Asahi Denka Kogyo K.K.) | 2 parts by weight |
| Diethyleneglycol monoethylether | 100 parts by weight |

Continually, by using MPA-600 (produced by Canon) and using the light of 290 to 400 nm wavelength, the pattern is exposed with an exposure dose of 400 mJ/cm$^2$. Then PEB is conducted on a hot plate for 120 seconds at 120° C. and development is carried out with methylisobutylketone. Thereby, the pattern of a liquid flow path forming material 207 and an ink-repellent agent layer 8 is conducted and an ink discharge port 209 is formed. In this example, a discharge port pattern of ϕ10 μm is formed.

Next, on the back surface of the processed substrate, using a polyetheramide resin composition HIMAL (manufactured by Hitachi Chemical Co., Ltd.), an etching mask having an opening portion with a 1 mm width and a 10 mm length is created. Then, the processed substrate is immersed in a TMAH aqueous solution of 22 wt % maintained at 80° C., and an ink supply opening 210 is formed. At this time, for the purpose of protecting the ink-repellent agent layer from the etching solution, a protective layer OBC (commercially available by Tokyo Oka Co.: not shown) is coated on the ink-repellent agent layer 8 to perform anisotropic etching.

Continually, the OBC used as the protective layer is dissolved and removed using xylene. Afterwards, using the same exposure apparatus as described above, the overall exposure is conducted with an exposure dose of 50,000 mJ/cm$^2$ over a nozzle forming member and the ink-repellent agent layer without mounting an optical filter, and flow path patterns 5 and 6 are solubilized. Next, by immersing the flow path patterns 5 and 6 in lactic acid methyl while adding an ultrasonic wave and dissolving and removing them, a liquid discharge ink jet head is created. The polyetheramide resin composition layer used as an etching mask is removed by dry etching using oxygen plasma.

The resultant produced ink jet head is mounted on a printer and the evaluation of discharging and recording is conducted. As a result, a good image recording can be performed.

Example 7

Except that as a positive resist the following photodegradable positive resist is used, an ink jet head is created in the same manner as in Example 6, and the evaluation of discharging and recording is conducted, thereby achieving a good image recording. Radical copolymer of anhydrous methacrylate/methyl methacrylate (monomer composition ratio: 10/90 mole ratio)

Weight average molecular weight (Mw: polystyrene conversion)=28,000

Dispersion (Mw/Mn)=3.3

Example 8

Except that as a positive resist the following photodegradable positive resist is used, an ink jet head is created in the same manner as in Example 6, and the evaluation of discharging and recording is conducted, thereby achieving a good image recording. Radical copolymer of anhydrous methacrylate/methyl methacrylate (monomer composition ratio: 10/85/5 mole ratio)

Weight average molecular weight (Mw: polystyrene conversion)=31,000

Dispersion (Mw/Mn)=3.5

As described above, the effects of the present invention will be listed below.

(1) Since essential processes for manufacturing a liquid discharge head are conducted by a photolithography technique using a photoresist or photosensitive dry film or the like, a micro portion of a liquid flow path forming material of the liquid discharge head can be formed to have a desired pattern, moreover, conveniently. In addition, it can be made easier to process a plurality of liquid discharge heads of the same construction simultaneously.

(2) The height of the liquid flow path can be altered in part and a liquid discharge head can be provided which has a high speed of refilling a recording solution and is capable of recording at a high speed.

(3) The thickness of the liquid flow path forming material layer can be partially varied and a liquid discharge head having a high mechanical strength can be provided.

(4) Since a liquid discharge head having a high discharge speed and a very high impact precision can be produced, a high image quality recording can be performed.

(5) A liquid discharge head of a high density multi-array nozzle can be obtained by simple means.

(6) Since the height of the liquid flow path and the length of the orifice portion (discharge port portion) can be controlled in such a manner that they can be changed simply and with a high precision by a coating film thickness of the resist film, the design of the liquid flow path can be easily varied and controlled.

(7) By employing a thermally crosslinkable positive resist, a process condition with a very high process margin can be set and a liquid discharge head can be produced with a high yield.

What is claimed is:

1. A method of producing a liquid discharge head comprising the steps of:

(a) forming a pattern of removable resin on a liquid flow path forming portion on a substrate having a liquid discharge energy generation element, wherein said pattern is formed by (1) forming on the substrate a first positive photosensitive material layer for photosensitizing by ionizing irradiation of a first wavelength band in a crosslinked state and forming a lower layer composed of a crosslinked positive photosensitive material layer by heat treating this positive photosensitive material layer;

(2) forming on the lower layer an upper layer composed of a second positive photosensitive material for photosensitizing by ionizing radiation of a second wavelength band to thereby obtain a two-layered structure;

(3) forming the upper layer with a desired pattern by irradiating the ionizing radiation of the second wavelength band to a predetermined portion of the upper layer of the two-layered structure and removing only the irradiated area of the upper layer by development treatment; and (4) forming the lower layer with a desired pattern by irradiating the ionizing radiation of the first wavelength band to a predetermined portion of the lower layer exposed by the pattern forming of the upper layer and conducting a development treatment, wherein the first positive photosensitive material layer includes a ternary copolymer having a primary component composed of methyl methacrylate, and methacrylic acid as a thermally crosslinkable factor and another factor for extending a sensitivity region relative to the ionizing radiation;

(b) applying and hardening a resin coating layer on the substrate to coat the pattern;

(c) exposing and hardening the resin coating layer and conducting a development treatment to form liquid discharge ports therein; and (d) dissolving and removing the pattern.

2. The method of claim 1, wherein a developing solution of the first positive photosensitive material includes at least:

(1) glycol ether having 6 or more carbon atoms miscible with water at any certain ratio;

(2) nitrogen-containing basic organic solvent; and (3) a developing solution containing water.

3. The method of claim 2, wherein the glycol ether comprises ethyleneglycol monobutyl ether, diethyleneglycol monobutyl ether, or a combination of ethyleneglycol monobutyl ether and diethyleneglycol monobutyl ether.

4. The method of claim 2, wherein the nitrogen-containing basic organic solvent comprises ethanolamine, morpholine, or a combination of ethanolamine and morpholine.

5. A liquid discharge head produced by the method of claim 1.

6. The liquid discharge head of claim 5, wherein a column-shaped member for capturing dust is formed on a liquid flow path as a material for forming the liquid flow path and this member does not reach to the substrate.

7. The liquid discharge head of claim 5, wherein a liquid supply opening commonly connected to each of the liquid flow paths is formed on the substrate and the height of the liquid flow path on the center portion of the liquid supply opening is lower than that of the liquid flow path on an opening circumferential portion of the liquid supply opening.

8. The liquid discharge head of claim 5, wherein a bubble generating chamber has a convex cross-sectional shape on the liquid discharge energy generating element.

9. A method of producing a liquid discharge head comprising the steps of:

(a) forming a pattern of removable resin on a liquid flow path forming portion on a substrate having a liquid discharge energy generation element, wherein said pattern is formed by (1) forming on the substrate a first positive photosensitive material layer for photosensitizing by a light of a first wavelength band and forming a thermally crosslinkable film by the first positive photosensitive material layer by means of thermal crosslinkable reaction;

(2) forming on the first positive photosensitive material layer a second positive photosensitive material layer for photosensitizing by a light of a second wavelength band different from the first wavelength band;

(3) reacting only a desired area of the second photosensitive material layer by irradiating the light of the second wavelength band through a mask to the substrate surface formed with the first and second positive photosensitive material layers, forming a desired pattern by development then forming a desired slope on a side wall of the pattern by heating the substrate; and (4) reacting a desired area of the first positive photosensitive material layer by irradiating the light of the first wavelength band through a mask to the substrate surface formed with the first and second positive photosensitive material layers, wherein the first positive photosensitive material layer includes a ternary copolymer having methyl methacrylate as a primary component, methyacrylic acid as a thermally crosslinkable factor, and another factor for extending a sensitivity region relative to the ionizing radiation;

(b) applying a resin coating layer on the substrate to coat the pattern;

(c) exposing and hardening the resin coating layer and conducting a development treatment to form liquid discharge ports therein; and (d) dissolving and removing the pattern.

10. The method of claim 9, wherein a developing solution of the first positive photosensitive material includes at least:

(1) glycol ether having 6 or more carbon atoms miscible with water at any certain ratio;

(2) nitrogen-containing basic organic solvent; and (3) a developing solution containing water.

11. The method of claim 10, wherein the glycol ether comprises ethyleneglycol monobutyl ether, diethyleneglycol monobutyl ether, or a combination of ethyleneglycol monobutyl ether and diethyleneglycol monobutyl ether.

12. The method of claim 10, wherein the nitrogen-containing basic organic solvent comprises ethanolamine, morpholine, or a combination of ethanolamine and morpholine.

13. A liquid discharge head produced by the method of claim 9.

14. The liquid discharge head of claim 13, wherein a column-shaped member for capturing dust is formed on a liquid flow path as a material for forming the liquid flow path and this member does not reach to the substrate.

15. The liquid discharge head of claim 13, wherein a liquid supply opening commonly connected to each of the liquid flow paths is formed on the substrate and the height of the liquid flow path on the center portion of the liquid supply opening is lower than that of the liquid flow path on an opening circumferential portion of the liquid supply opening.

16. The liquid discharge head of claim 9, wherein a bubble generating chamber has a convex cross-sectional shape on the liquid discharge energy generating element.

* * * * *

UNITED STATES PATENT AND TRADEMARK OFFICE

CERTIFICATE OF CORRECTION

PATENT NO. : 6,986,980 B2
APPLICATION NO. : 10/615302
DATED : January 17, 2006
INVENTOR(S) : Masahiko Kubota et al.

It is certified that error appears in the above-identified patent and that said Letters Patent is hereby corrected as shown below:

COVER [56] FOREIGN PATENT DOCUMENTS

"GB 1275508 A2 1/2003" should be deleted;
"JP 3010089 1/1991" should read --JP 3-010089 1/1991--; and
"JP 2000326515 11/2000" should read --JP 2000/326515 11/2000--.

COLUMN 2

Line 54, "no" should read --on--; and
Line 58, "The both" should read --Both of the--.

COLUMN 7

Line 49, "polymethyliopropenyl" should read --polymethylisopropenyl--.

COLUMN 8

Line 27, "corsslinkable" should read --crosslinking--; and
Line 44, "occur" should read --cause--.

COLUMN 10

Line 66, "portion is less" should read --portion, less likely--.

COLUMN 14

Line 1, "enable" should read --enables--.

COLUMN 15

Line 37, "is" should read --as--.

COLUMN 16

Line 55, "methacrylate anhydride" should be deleted.

COLUMN 20

Line 65, "does" should read --dose--.

UNITED STATES PATENT AND TRADEMARK OFFICE

CERTIFICATE OF CORRECTION

PATENT NO. : 6,986,980 B2
APPLICATION NO. : 10/615302
DATED : January 17, 2006
INVENTOR(S) : Masahiko Kubota et al.

It is certified that error appears in the above-identified patent and that said Letters Patent is hereby corrected as shown below:

COLUMN 21

Line 5, “does” should read --dose--.

COLUMN 23

Line 44, “and hardening” should be deleted.

COLUMN 24

Line 44, “methyacrylic” should read --methacrylic--.

Signed and Sealed this

Twenty-second Day of August, 2006

JON W. DUDAS
*Director of the United States Patent and Trademark Office*